(12) United States Patent
Nakajun et al.

(10) Patent No.: US 12,514,013 B2
(45) Date of Patent: Dec. 30, 2025

(54) IMAGING DEVICE INCLUDING MICROLENS WITH PLURAL ALTERNATING CURVES

(71) Applicant: Panasonic Intellectual Property Management Co., Ltd., Osaka (JP)

(72) Inventors: Akio Nakajun, Toyama (JP); Sogo Ota, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 654 days.

(21) Appl. No.: 17/933,091

(22) Filed: Sep. 17, 2022

(65) Prior Publication Data

US 2023/0009806 A1    Jan. 12, 2023

Related U.S. Application Data

(63) Continuation of application No. PCT/JP2021/014564, filed on Apr. 6, 2021.

(30) Foreign Application Priority Data

Apr. 15, 2020    (JP) .................................. 2020-073148

(51) Int. Cl.
*H10F 39/00* (2025.01)
*H10F 39/18* (2025.01)
(Continued)

(52) U.S. Cl.
CPC ....... *H10F 39/8063* (2025.01); *H10F 39/182* (2025.01); *H10F 39/804* (2025.01); *H10K 30/88* (2023.02); *H10K 39/32* (2023.02)

(58) Field of Classification Search
CPC .......... G02B 3/00; H10K 30/88; H10K 30/87; H10K 39/32; H10F 39/8063; H10F 39/182; H10F 39/804; H10F 39/12
See application file for complete search history.

(56) References Cited

U.S. PATENT DOCUMENTS

| 2011/0109776 A1 | 5/2011 | Kawai |
| 2019/0035827 A1* | 1/2019 | Kawabata ............. H10F 39/182 |

(Continued)

FOREIGN PATENT DOCUMENTS

| JP | 2011-103335 A | 5/2011 |
| JP | 2017-212291 | 11/2017 |

(Continued)

OTHER PUBLICATIONS

International Search Report of PCT application No. PCT/JP2021/014564 dated Jun. 15, 2021.

*Primary Examiner* — Kelly L Jerabek
(74) *Attorney, Agent, or Firm* — Rimon P.C.

(57) ABSTRACT

An imaging device includes a photoelectric converter and a microlens. The microlens is provided above the photoelectric conversion layer. In a cross-section of the imaging device, an upper surface of the microlens forms a contour line in which a first curve projecting upward is connected to a second curve projecting downward at a first inflection point located between the first curve and the second curve. In this cross-section, a curvature radius of the second curve at a lower end of the second curve is larger than a distance in a thickness direction of the microlens from an upper end of the first curve to the first inflection point.

18 Claims, 17 Drawing Sheets

(51) Int. Cl.
  *H10K 30/88* (2023.01)
  *H10K 39/32* (2023.01)

(56) References Cited

U.S. PATENT DOCUMENTS

| | | | |
|---|---|---|---|
| 2019/0081098 A1* | 3/2019 | Lenchenkov | G02B 13/0085 |
| 2020/0274077 A1 | 8/2020 | Ujiie et al. | |
| 2022/0392937 A1* | 12/2022 | Yoshioka | H10F 39/811 |
| 2023/0026747 A1* | 1/2023 | Moriya | H04N 25/62 |

FOREIGN PATENT DOCUMENTS

| | | |
|---|---|---|
| JP | 2018-110147 | 7/2018 |
| WO | 2019/093188 | 5/2019 |

* cited by examiner

IMAGING DEVICE INCLUDING MICROLENS WITH PLURAL ALTERNATING CURVES

BACKGROUND

1. Technical Field

The present disclosure relates to an imaging device.

2. Description of the Related Art

Solid-state imaging devices have been widely used in digital still cameras, digital video cameras, and so forth. An amplification type solid-state imaging device, a charge transfer type solid-state imaging device, and the like have been known as the solid-state imaging devices. A MOS image sensor, such as a complementary metal oxide semiconductor (CMOS) image sensor and the like, is a typical example of the amplification type solid-state imaging device, and a charge coupled device (CCD) image sensor is a typical example of the charge transfer type solid-state imaging device. In recent years, CMOS image sensors that consume low power voltages are frequently used as the solid-state imaging devices to be embedded in mobile devices such as camera-equipped cellular telephones and smartphones from the viewpoint of power consumption and the like. For example, Japanese Unexamined Patent Application Publication No. 2018-110147 discloses a solid-state imaging device that includes a microlens.

SUMMARY

In one general aspect, the techniques disclosed here feature an imaging device including a photoelectric converter, and a microlens provided above the photoelectric converter. In a cross-section of the imaging device, an upper surface of the microlens forms a contour line in which a first curve projecting upward is connected to a second curve projecting downward at a first inflection point located between the first curve and the second curve. Moreover, a curvature radius of the second curve at a lower end of the second curve is larger than a distance in a thickness direction of the microlens from an upper end of the first curve to the first inflection point.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Underlying Knowledge Forming Basis of the Present Disclosure

Figure 1:
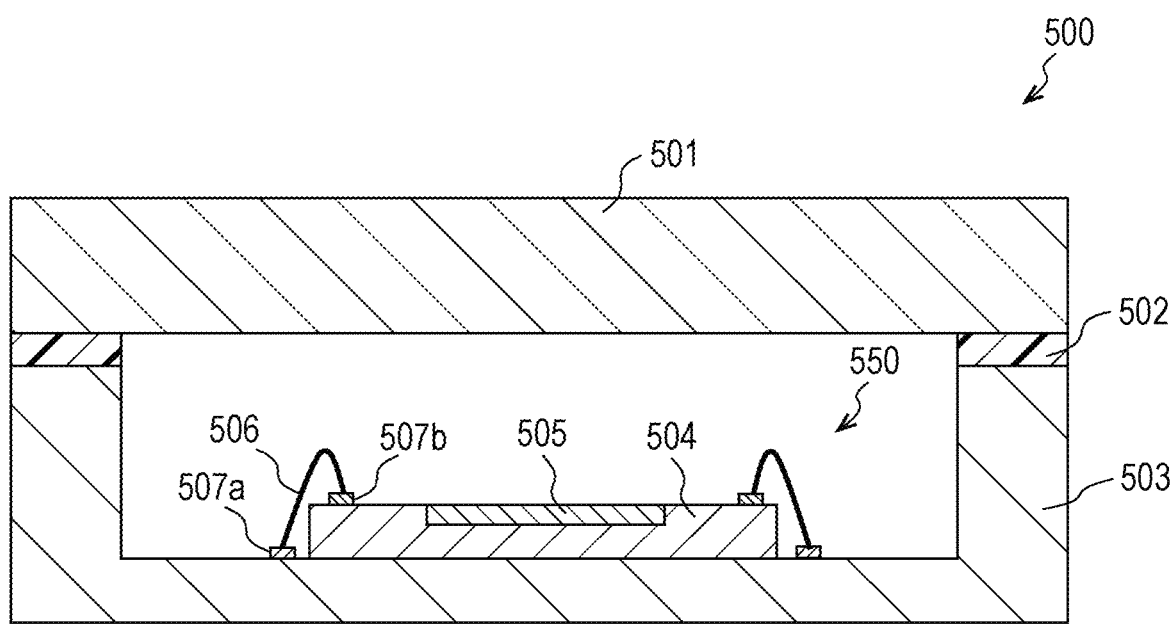
FIG. 1 is a schematic diagram illustrating an imaging system according to an aspect for reference.

FIG. 1 illustrates an imaging system 500 according to an aspect for reference. The imaging system 500 includes a transparent substrate 501, a resin layer 502, a package 503, an imaging device 550, wiring 507a, and bonding wires 506.

The package 503 and the transparent substrate 501 collectively constitute a housing. The imaging device 550 is housed in this housing. To be more precise, in the housing, the package 503 is attached to the transparent substrate 501 by using the resin layer 502.

The imaging device 550 includes a semiconductor substrate 504, a photoelectric converter 505, and wiring 507b. Although illustration is omitted in FIG. 1, the imaging device 550 also includes other elements such as a microlens and a color filter (see FIGS. 2A and 2B).

As with the wiring 507a, the semiconductor substrate 504 is disposed on a bottom surface in the package 503. The photoelectric converter 505 is disposed either in the semiconductor substrate 504 or above the semiconductor substrate 504.

The imaging device 550 is connected to the wiring 507a by using the bonding wires 506. Specifically, the bonding wires 506 connect the wiring 507a to the wiring 507b. The wiring 507b in FIG. 1 schematically illustrates wiring that is present on an upper part of the imaging device 550. Note that illustration of the wiring 507b is omitted in FIGS. 2A and 2B.

The imaging device 550 may be either a CMOS image sensor or a CCD image sensor. Alternatively, the imaging device 550 may be a stacked sensor.

Examples of the material of the package 503 include ceramics, plastics, and the like. Examples of the material of the transparent substrate 501 include glass and the like. To be more precise, the transparent substrate 501 may be a glass plate. Examples of the material of the resin layer 502 include organic resins such as acrylic, polyimide, and epoxy resins. An example of a material of the semiconductor substrate 504 is silicon.

In this aspect for reference, a material of the bonding wires 506 is a metal. Examples of the material of the bonding wires 506 include aluminum, copper, silver, gold, and the like. The material of the bonding wires 506 may include at least two metals selected from these metals. The same applies to materials of the wiring 507a and the wiring 507b. In a specific example, the material of the bonding wires 506 is gold while the material of the wiring 507a and the wiring 507b is copper.

Figure 2A:
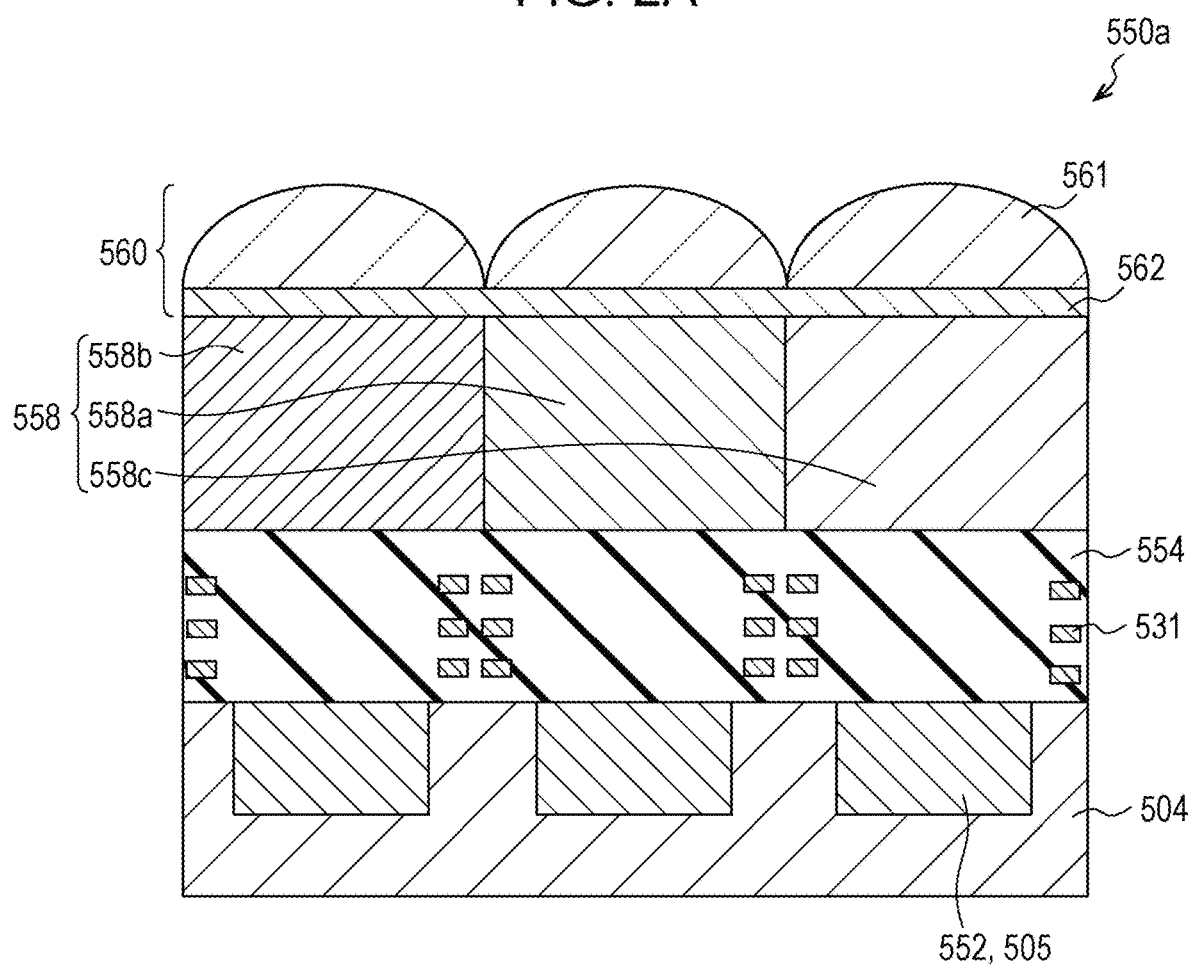
FIG. 2A is a sectional view illustrating an example of an imaging device according to the aspect for reference.
Figure 2B:
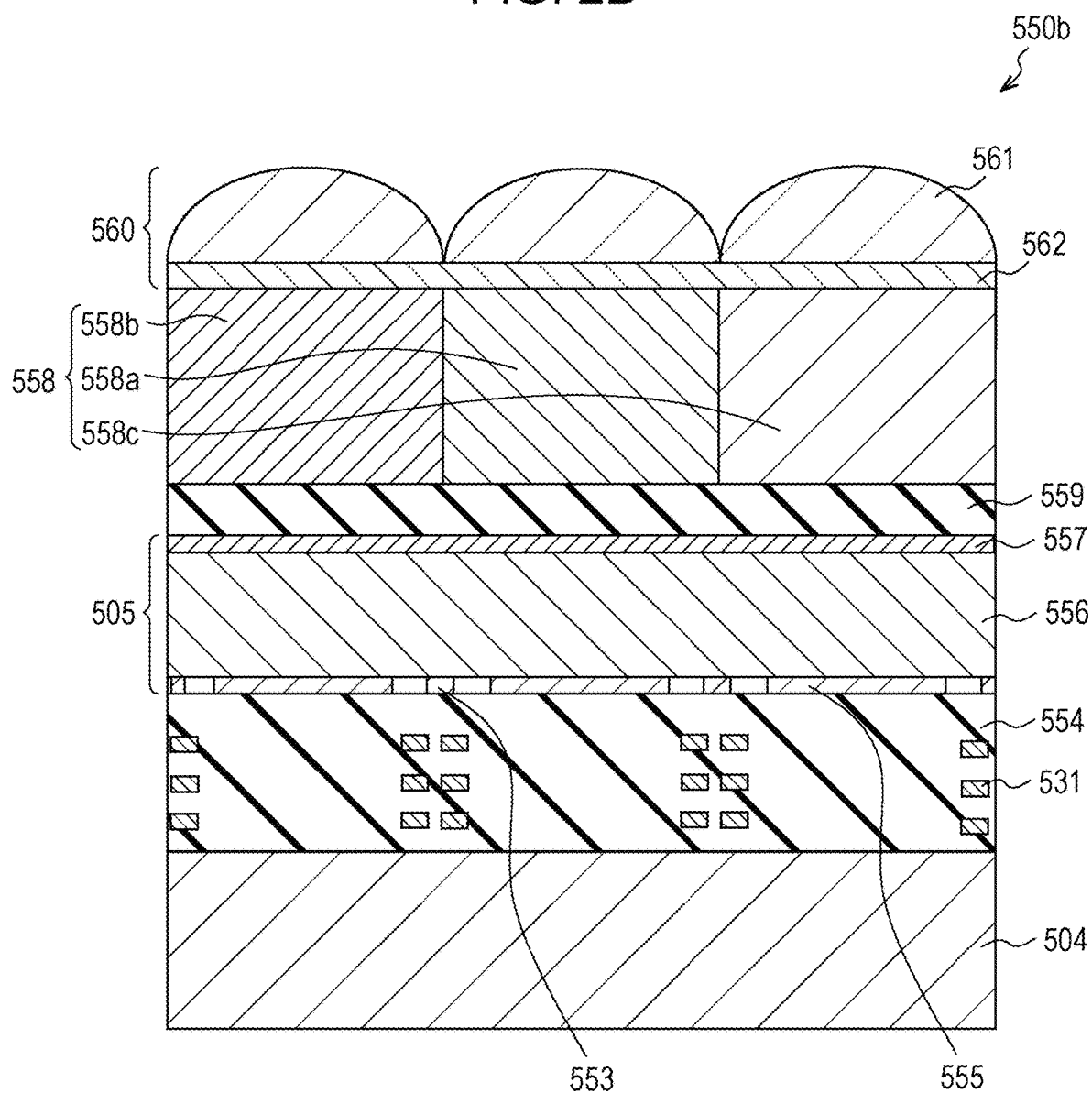
FIG. 2B is a sectional view illustrating another example of the imaging device according to the aspect for reference.

FIG. 2A illustrates an imaging device 550a that represents an example of the imaging device 550. FIG. 2B illustrates an imaging device 550b that represents another example of the imaging device 550.

The imaging device 550a illustrated in FIG. 2A includes the semiconductor substrate 504, photodiodes 552, an interlayer insulating layer 554, wiring 531, a color filter layer 558, and a microlens 560.

The photodiodes 552 are disposed in the semiconductor substrate 504. Each photodiode 552 constitutes the photoelectric converter 505.

The interlayer insulating layer 554 is disposed on the semiconductor substrate 504. The wiring 531 is buried in the interlayer insulating layer 554. Examples of the material of the wiring 531 include a metal, a semiconductor, and the like. In the example of FIG. 2A, the interlayer insulating layer 554 has a film shape.

The color filter layer 558 is disposed on the interlayer insulating layer 554. The color filter layer 558 includes a green color filter 558a, a blue color filter 558b, and a red color filter 558c.

The microlens 560 is disposed on the color filter layer 558. The microlens 560 includes lens portions 561 and a planar portion 562. The lens portions 561 focus light onto the photodiodes 552. The planar portion 562 is interposed between the lens portions 561 and the color filter layer 558. In the example of FIG. 2A, the planar portion 562 has a film shape. Accordingly, the planar portion 562 may also be referred to as a planarized film.

The imaging device 550b illustrated in FIG. 2B includes the semiconductor substrate 504, the interlayer insulating layer 554, the wiring 531, a shield electrode 553, pixel electrodes 555, a photoelectric conversion layer 556, a counter electrode 557, an insulating layer 559, the color filter layer 558, and the microlens 560. The imaging device 550b constitutes a stacked sensor.

The pixel electrodes 555, the photoelectric conversion layer 556, and the counter electrode 557 collectively constitute the photoelectric converter 505. The photoelectric conversion layer 556 carries out photoelectric conversion. The pixel electrodes 555 collect electric charges obtained by the photoelectric conversion. Sensitivity of the photoelectric conversion layer 556 to the light is adjusted by controlling a voltage at the counter electrode 557.

In the example of FIG. 2B, the photoelectric conversion layer 556 has a film shape. To be more precise, the photoelectric conversion layer 556 is an organic film. The counter electrode 557 is a transparent electrode.

The insulating layer 559 is disposed on the counter electrode 557. The insulating layer 559 is a protective layer that protects the photoelectric converter 505. The insulating layer 559 has a film shape. The color filter layer 558 is disposed on the insulating layer 559, and the microlens 560 is disposed on the color filter layer 558.

Figure 3:
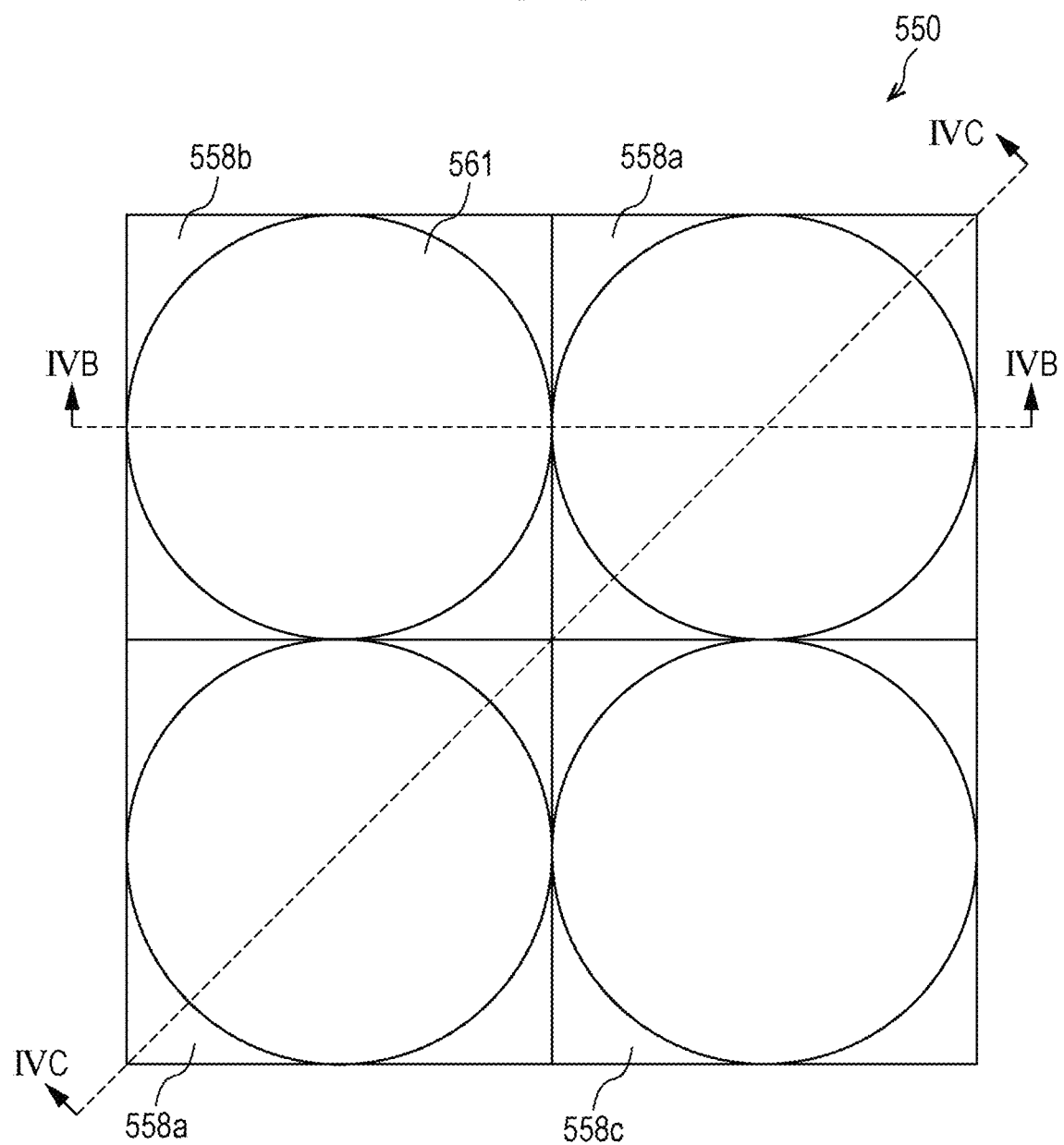
FIG. 3 is a top plan view of the imaging device.

FIG. 3 is a top plan view of the imaging device 550 illustrated in FIGS. 2A and 2B. As illustrated in FIG. 3, each lens portion 561 is disposed corresponding to one of the green color filter 558a, the blue color filter 558b, and the red color filter 558c. Note that illustration of the planar portion 562 is omitted in FIG. 3.

Figure 4A:
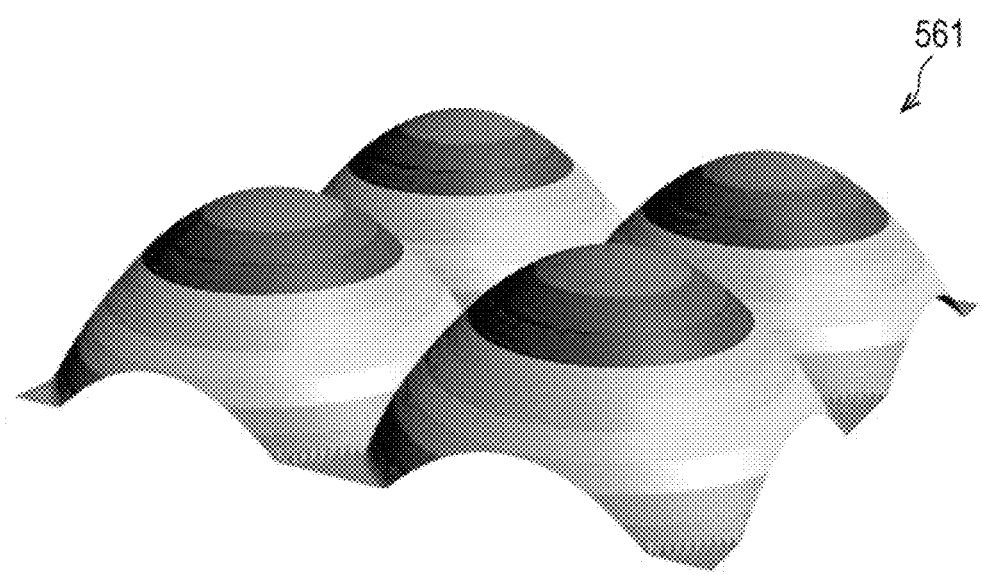
FIG. 4A is a perspective view illustrating lens portions of a microlens according to the aspect for reference.
Figure 4B:
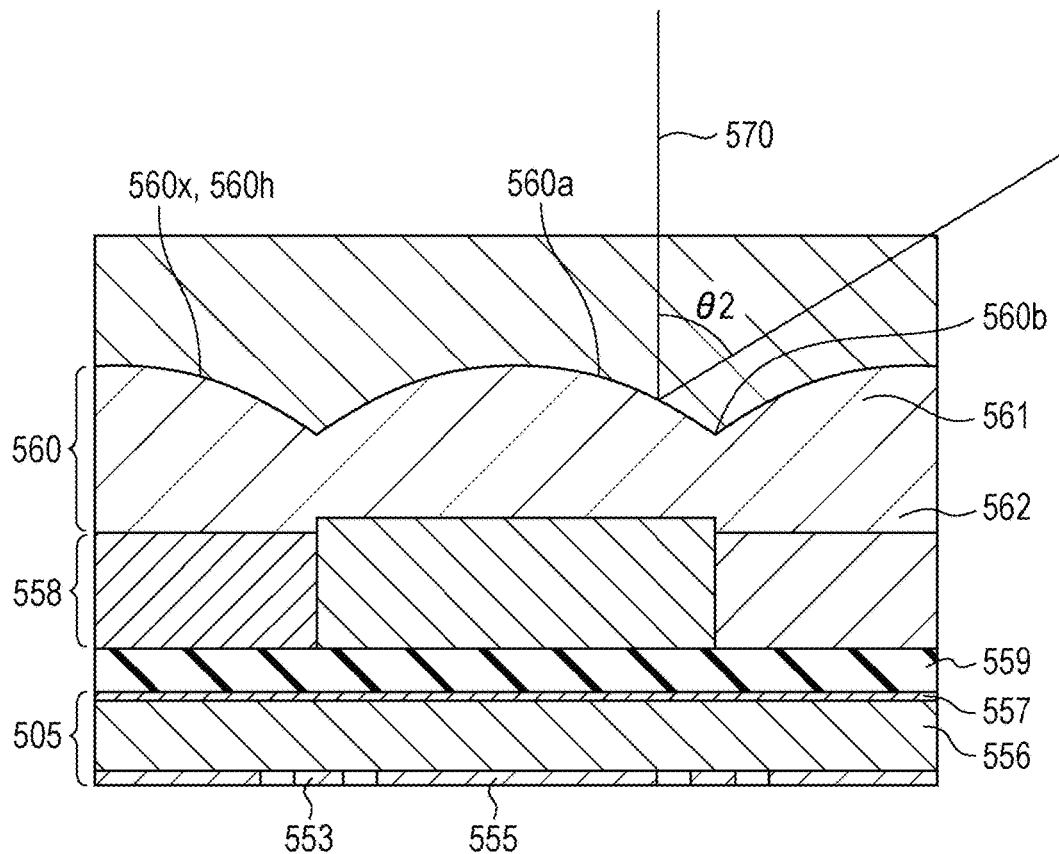
FIG. 4B is a sectional view illustrating the microlens according to the aspect for reference.
Figure 4C:
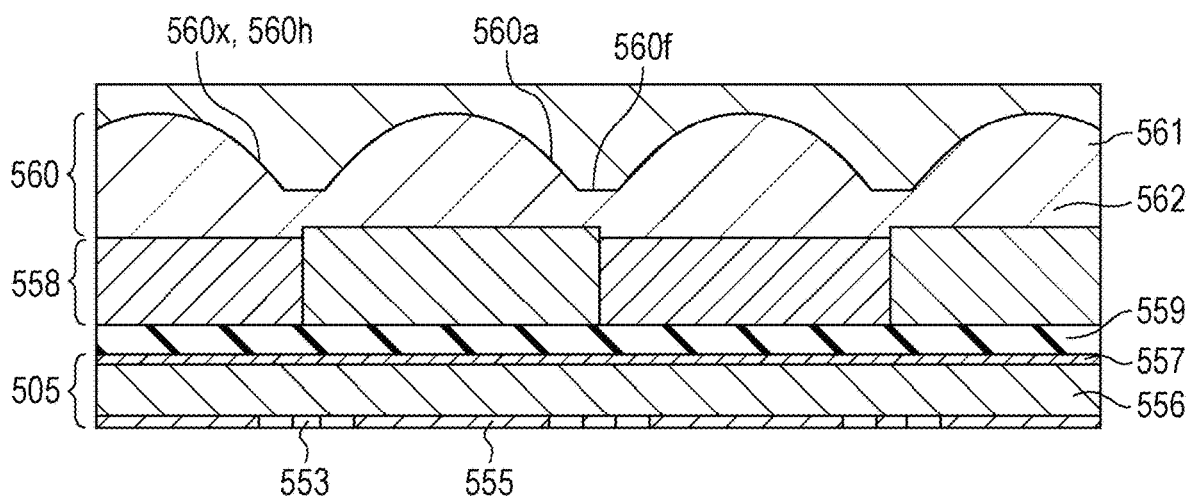
FIG. 4C is another sectional view illustrating the microlens according to the aspect for reference.

FIG. 4A is a perspective view of the lens portions 561 in the microlens 560. FIG. 4B is a sectional view of the microlens 560 of the imaging device 550b, which is taken along the IVB-IVB line in FIG. 3. FIG. 4C is a sectional view of the microlens 560 which is taken along the IVC-IVC line in FIG. 3. Each of FIGS. 4B and 4C also illustrates the shield electrode 553, the pixel electrodes 555, the photoelectric conversion layer 556, the counter electrode 557, the insulating layer 559, and the color filter layer 558.

Incidentally, a flare may occur, for example, when the microlens is irradiated with intense light such as sunlight. The flare occurs due to the light that is reflected from the microlens and leaks into a dark portion. The flare may depend on optical properties of the microlens.

The flare will be described further with reference to FIGS. 5 to 6C.

Figure 5:
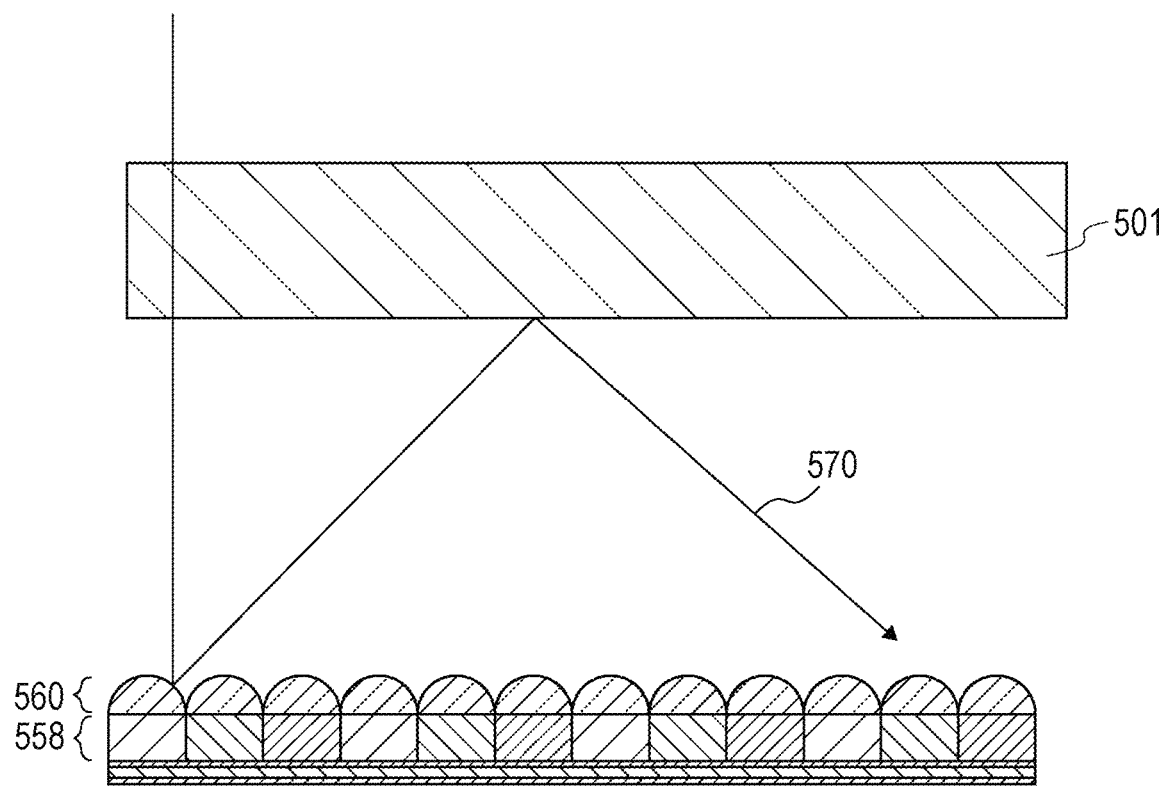
FIG. 5 is an explanatory diagram of a flare.
Figure 6A:
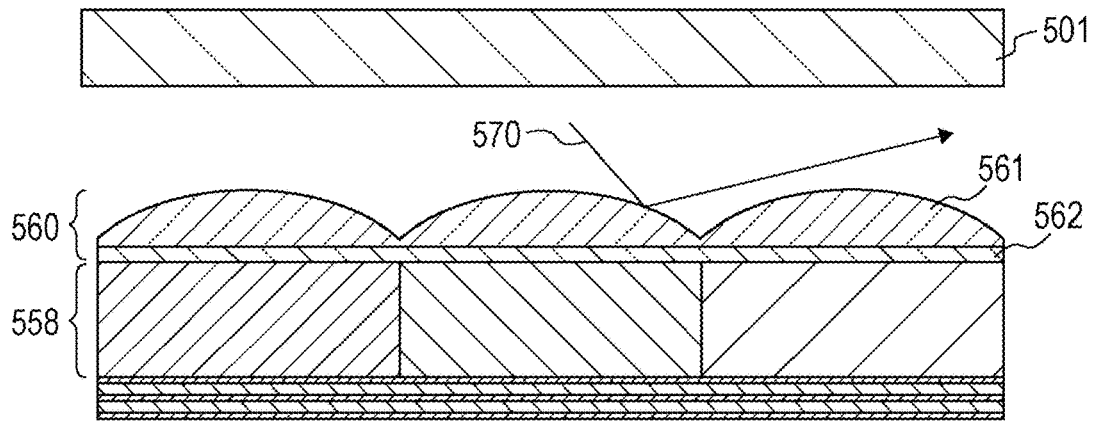
FIG. 6A is an explanatory diagram of another flare.
Figure 6B:
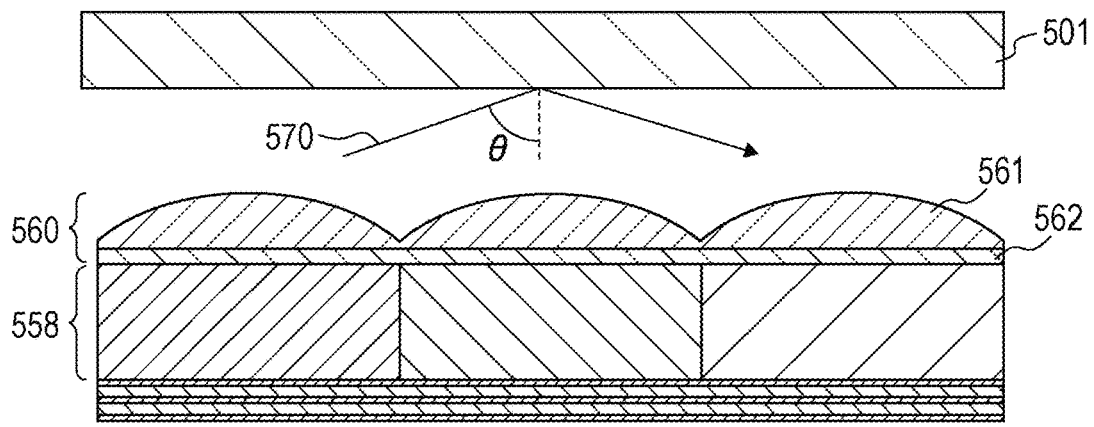
FIG. 6B is an explanatory diagram of still another flare.
Figure 6C:
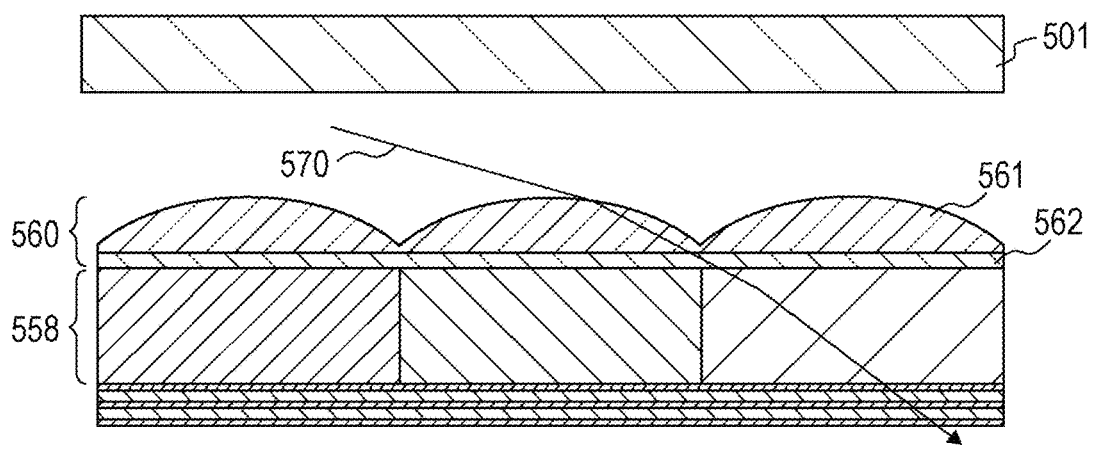
FIG. 6C is an explanatory diagram of yet another flare.

FIG. 5 schematically illustrates a situation where the imaging device 550 is irradiated with high-intensity light.

In FIG. 4B and FIGS. 5 to 6C, an arrow 570 schematically represents a direction of travel of the light. The light may be reflected from the microlens 560 to various directions. As illustrated in FIG. 5, reflected light caused by the microlens 560 is further reflected from the transparent substrate 501. The reflected light caused by the transparent substrate 501 reapproaches the photoelectric converter 505. Stray light may occur as a consequence of reflection of the light from the microlens 560 and the transparent substrate 501. Then, the stray light may cause the flare.

Here, reflection from components other than the transparent substrate 501 may also lead to the occurrence of the stray light and the flare. For example, reflection from a camera housing may also develop the straight light and the flare.

According to investigations conducted by the inventors, the light is apt to be reflected at a large angle in structures illustrated in FIGS. 4A to 4C (see a result of optical simulations to be described later). Here, reflection of the light at a large angle means an increase in an angle θ2 illustrated in FIG. 4B. The light reflected from the lens portion 561 travels in a direction close to a horizontal direction when the light is reflected at a large angle, and the flare may occur as a consequence.

There is a demand for improving quality of an image created by the imaging device. In order to improve the image quality, it is effective to suppress the flare. Given the circumstance, the inventors have investigated techniques suitable for suppressing the flare.

Outlines of Aspects of the Present Disclosure

An imaging device according to a first aspect of the present disclosure includes:
    a photoelectric converter; and
    a microlens provided above the photoelectric converter.
    In a cross-section of the imaging device,
    an upper surface of the microlens forms a contour line in which a first curve projecting upward is connected to a second curve projecting downward at a first inflection point located between the first curve and the second curve, and
    a curvature radius of the second curve at a lower end of the second curve is larger than a distance in a thickness direction of the microlens from an upper end of the first curve to the first inflection point.

The techniques according to the first aspect are suitable for suppressing a flare.

A second aspect of the present disclosure provides the imaging device according to the first aspect, for example, in which the curvature radius of the second curve at the lower end of the second curve may be larger than a distance in the thickness direction from the upper end to the lower end in the cross-section.

The techniques according to the second aspect are suitable for suppressing the flare.

A third aspect of the present disclosure provides the imaging device according to the first or second aspect, for example, in which the curvature radius of the second curve at the lower end of the second curve may be larger than a distance in the thickness direction from the upper end to a lower surface of the microlens in the cross-section.

The techniques according to the third aspect are suitable for suppressing the flare.

A fourth aspect of the present disclosure provides the imaging device according to any one of the first to third aspects, for example, in which the imaging device may further include an amplifying transistor provided with a gate electrode, and a focal point of the first curve may be located below the gate electrode in the cross-section.

The position of the focal point in the fourth aspect is a specific example of the position of the focal point.

A fifth aspect of the present disclosure provides the imaging device according to any one of the first to fourth aspects, for example, in which the imaging device may further include an amplifying transistor provided with a gate electrode, and a focal point of the first curve may be located away from the gate electrode in plan view.

According to the fifth aspect, the light incident on the first curve is less likely to affect the amplifying transistor. This feature is advantageous from the viewpoint of reducing noise.

A sixth aspect of the present disclosure provides the imaging device according to the fourth or fifth aspect, for example, in which the photoelectric converter may include a photoelectric conversion layer that converts light into electric charges, and a pixel electrode that collects the electric charges, and a first segment that connects a first end of the first curve to the focal point and a second segment that connects a second end of the first curve to the focal point may intersect the pixel electrode in the cross-section.

According to the sixth aspect, the pixel electrode can suppress an adverse effect of the light incident on the first curve on an element present below the pixel electrode. This structure is advantageous from the viewpoint of reducing the noise.

A seventh aspect of the present disclosure provides the imaging device according to the sixth aspect, for example, in which the pixel electrode may contain at least one selected from the group consisting of a metal and a metal compound.

According to the seventh aspect, it is possible to construct the pixel electrode having the above-mentioned noise reduction action.

An eighth aspect of the present disclosure provides the imaging device according to any one of the first to seventh aspects, for example, in which the photoelectric converter may include a photoelectric conversion layer that converts light into electric charges, and a pixel electrode that collects the electric charges, the imaging device may further include a shield electrode that is located away from the pixel electrode and that collects the electric charges, in the cross-section, a reference straight line passing through the upper end and extending in the thickness direction may pass through the pixel electrode, and the shield electrode may be located outside of an outer end of the pixel electrode when viewed from the reference straight line.

According to the eighth aspect, the shield electrode can suppress crosstalk. Moreover, the first curve can avoid a circumstance in which the shield electrode excessively collects the electric charges.

A ninth aspect of the present disclosure provides the imaging device according to any one of the first to eighth aspects, for example, in which the curvature radius of the second curve at the lower end of the second curve may be smaller than a curvature radius of the first curve at the upper end of the first curve in the cross-section.

The structure of the ninth aspect is a specific example of the structure of the imaging device.

A tenth aspect of the present disclosure provides the imaging device according to any one of the first to ninth aspects, for example, in which the curvature radius of the second curve at the lower end of the second curve may be larger than 50 nm in the cross-section.

The techniques according to the tenth aspect are suitable for suppressing the flare.

An eleventh aspect of the present disclosure provides the imaging device according to any one of the first to tenth aspects, for example, in which a deflection angle of a direction of extension of a tangent to the contour line at the first inflection point relative to a horizontal direction being orthogonal to the thickness direction may be larger than 0 degrees and smaller than or equal to 35 degrees in the cross-section.

The techniques according to the eleventh aspect are suitable for suppressing the flare.

A twelfth aspect of the present disclosure provides the imaging device according to any one of the first to eleventh aspects, for example, in which the microlens may include a lens portion including the upper surface, and a planar portion connected to the lens portion, and a dimension in the thickness direction of the planar portion may be larger than a distance in the thickness direction from the upper end to the lower end in the cross-section.

The microlens according to the twelfth aspect can be manufactured easily. Therefore, the twelfth aspect can easily ensure reliability of the imaging device.

A thirteenth aspect of the present disclosure provides the imaging device according to any one of the first to twelfth aspects, for example, in which the photoelectric converter may include a photoelectric conversion layer that converts light into electric charges, the first curve, the second curve, and a third curve projecting upward may be connected in this order in the contour line in the cross-section, and the first curve, the second curve, and the third curve may overlap the photoelectric conversion layer in plan view.

According to the thirteenth aspect, the light incident on the imaging device can be easily subjected to the efficient photoelectric conversion.

A fourteenth aspect of the present disclosure provides the imaging device according to any one of the first to thirteenth aspects, for example, in which the upper surface may include first curved surfaces each projecting upward, and second curved surfaces each projecting downward, directions of arrangement of the first curved surfaces and directions of arrangement of the second curved surfaces may each include a longitudinal direction, a lateral direction, and an oblique direction, and when the cross-section is referred to as a specific cross-section, at least one selected from the group consisting of a longitudinal cross-section spreading in the thickness direction and the longitudinal direction, a lateral cross-section spreading in the thickness direction and the lateral direction, and an oblique cross-section spreading in the thickness direction and the oblique direction may correspond to the specific cross-section.

The structure of the fourteenth aspect is a specific example of the structure of the imaging device.

A fifteenth aspect of the present disclosure provides the imaging device according to the fourteenth aspect, for example, in which the oblique cross-section may correspond to the specific cross-section.

A sixteenth aspect of the present disclosure provides the imaging device according to the fourteenth aspect, for example, in which the oblique cross-section and at least one selected from the group consisting of the longitudinal cross-section and the lateral cross-section may each correspond to the specific cross-section, and the lower end in the oblique cross-section may be located below the lower end in the at least one selected from the group consisting of the longitudinal cross-section and the lateral cross-section.

The structures of the fifteenth and sixteenth aspects are specific examples of the structure of the imaging device.

An imaging device according to a seventeenth aspect of the present disclosure includes:

a photoelectric conversion layer that converts light into electric charges; and a microlens provided above the photoelectric conversion layer.

In a cross-section of the imaging device, an upper surface of the microlens forms a contour line in which a first curve projecting upward, a second curve projecting downward, and a third curve projecting upward are connected in this order, and the first curve, the second curve, and the third curve overlap the photoelectric conversion layer in plan view.

The techniques according to the seventeenth aspect are suitable for subjecting the light incident on the imaging device to efficient photoelectric conversion while suppressing a flare.

An imaging device according to an eighteenth aspect of the present disclosure includes:

a photoelectric converter; and a microlens provided above the photoelectric converter.

In a cross-section of the imaging device, an upper surface of the microlens forms a contour line in which a first curve projecting upward is connected to a second curve projecting downward, and a curvature radius at a lower end of the second curve is larger than a half of a distance in a thickness direction of the microlens from the lower end of the second curve to an upper end of the first curve.

The techniques according to the eighteenth aspect are suitable for suppressing the flare.

An imaging device according to an nineteenth aspect of the present disclosure includes:

a photoelectric converter; and a microlens provided above the photoelectric converter.

In a cross-section of the imaging device, an upper surface of the microlens forms a contour line in which a first curve projecting upward is connected to a second curve projecting downward at a first inflection point located between the first curve and the second curve, and a deflection angle of a direction of extension of a tangent to the contour line at the first inflection point relative to a horizontal direction being orthogonal to the thickness direction of the microlens is larger than 0 degrees and smaller than or equal to 35 degrees.

The techniques according to the nineteenth aspect are suitable for suppressing the flare.

An imaging device according to a twentieth aspect of the present disclosure includes:

a photoelectric converter; and a microlens provided above the photoelectric converter.

In a cross-section of the imaging device, an upper surface of the microlens forms a contour line in which a first curve projecting upward is connected to a second curve projecting downward, and a curvature radius at a lower end of the second curve is larger than a curvature radius at an upper end of the first curve.

The techniques according to the twentieth aspect are suitable for suppressing the flare.

An embodiment of the present disclosure will be described below with reference to the accompanying drawings.

It is to be noted that the present disclosure is not limited only to the following embodiment. Moreover, appropriate changes are possible within such a range that does not depart from the scope for exerting effects of the present disclosure. In addition, it is also possible to combine one embodiment with another embodiment. In the following description, constituents that are identical or similar to each other are denoted by the same reference signs. In the meantime, duplicate explanations may be omitted as appropriate.

In this specification, the terms including "above", "below", "upper surface", "lower surface", and so on are used solely in order to designate relative layouts among components and are not intended to limit a posture of an imaging device in its use.

This specification may use ordinal numbers such as "first", "second", "third" as appropriate. When an ordinal number is attached to a certain constituent, existence of an element of the same type with a smaller ordinal number is not always essential. Meanwhile, such ordinal numbers are interchangeable as appropriate.

In this specification, a flare is a concept that encompasses a ghost.

In this specification, the term "metal" is a concept that encompasses a single metal made of one type of a metallic element and an alloy made of two or more metallic elements.

Thicknesses, lengths, and other dimensions in the drawings may be different from actual dimensions due to reasons associated with creation of the drawings. Meanwhile, the number of conductor patterns on a principal surface of an optical element may also be different from reality in order to adopt an appropriate quantity for the convenience of ease of illustration.

Embodiment

Figure 7:
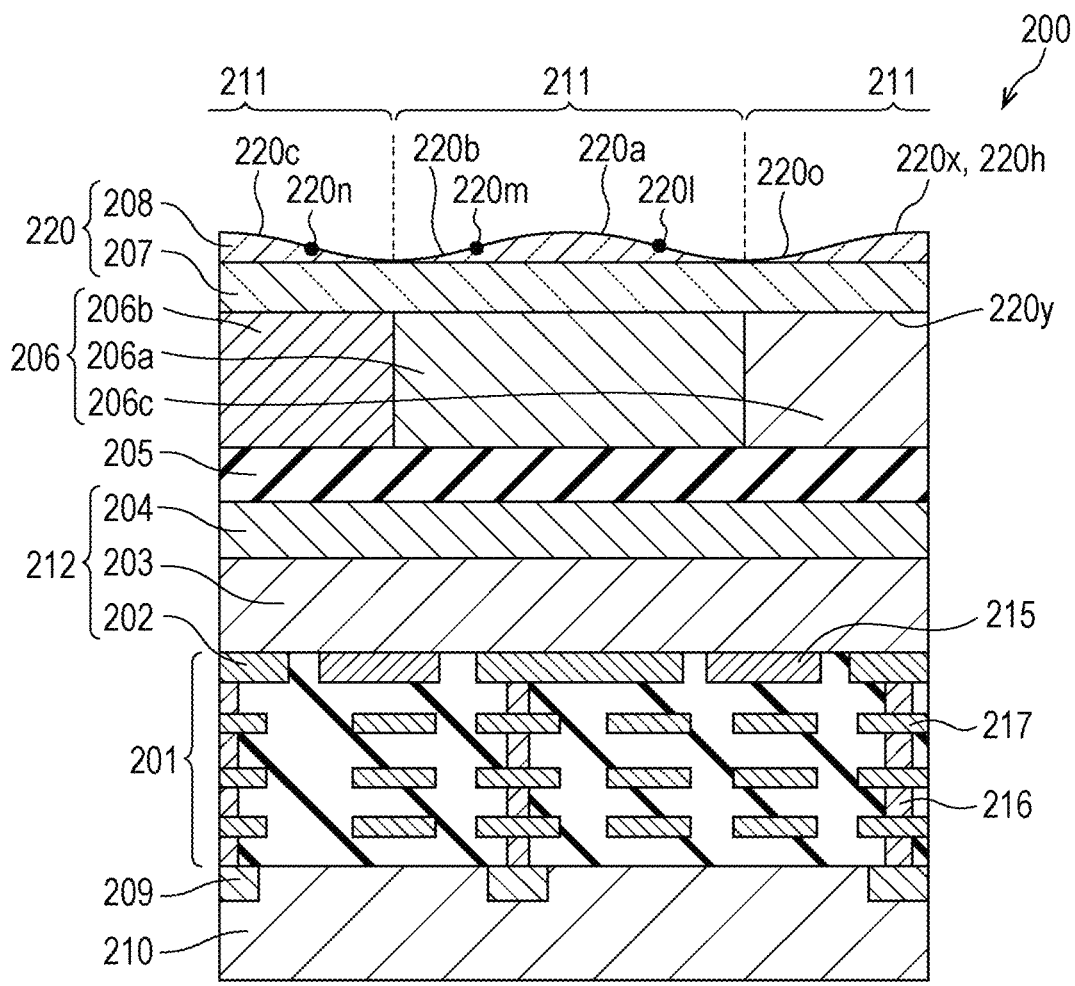
FIG. 7 is a sectional view of an imaging device according to an embodiment.
Figure 7:
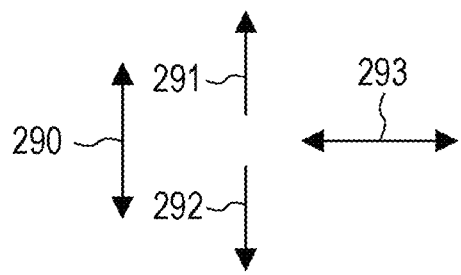

FIG. 7 is a sectional view of an imaging device 200 according to the present embodiment. The imaging device 200 constitutes a stacked sensor.

The imaging device 200 according to this embodiment includes a semiconductor substrate 210 and multiple pixels 211. The multiple pixels 211 are located on the semiconductor substrate 210. Each of the multiple pixels 211 includes a photoelectric converter 212 and a microlens 220. The microlens 220 is located above the photoelectric converter 212.

The photoelectric converter 212 includes a counter electrode 204, pixel electrodes 202, and a photoelectric conversion layer 203. The pixel electrodes 202 are located below the counter electrode 204. The photoelectric conversion layer 203 is located between the counter electrode 204 and the pixel electrodes 202. The counter electrode 204 is designed to transmit the light therethrough. The photoelectric conversion layer 203 converts the light into electric charges. The pixel electrodes 202 collect the electric charges generated by photoelectric conversion in the photoelectric conversion layer 203. In a typical example, the photoelectric conversion layer 203 has a film shape. The electric charges collected by the pixel electrodes 202 may be used for creating an image.

In this embodiment, each pixel electrode 202 contains at least one selected from the group consisting of a metal and a metal compound. Examples of the metal contained in the pixel electrode 202 include titanium (Ti), tantalum (Ta), and the like. A metal nitride is an example of the metal compound contained in the pixel electrode 202. To be more precise, examples of the metal compound contained in the pixel electrode 202 include titanium nitride (TiN), tantalum nitride (TaN), and the like. Each of titanium (Ti), tantalum (Ta), titanium nitride (TiN), and tantalum nitride (TaN) is opaque. Nonetheless, the pixel electrode 202 may contain a transparent material such as indium tin oxide (ITO). In this embodiment, the counter electrode 204 contains a transparent material such as ITO.

Moreover, the imaging device 200 includes an insulating layer 205 formed on the counter electrode 204 of the photoelectric converter 212, and a color filter layer 206 formed on the insulating layer 205.

The insulating layer 205 functions as a protective layer that protects the photoelectric converter 212. The insulating layer 205 has a film shape in this embodiment. Examples of the material contained in the insulating layer 205 include a silicon oxide, a metal oxide, and the like. Examples of the metal oxide contained in the insulating layer 205 include aluminum oxide ($Al_2O_3$), silicon oxynitride (SiON), and the like. The insulating layer 205 may be a laminate including a silicon oxynitride layer and a metal oxide layer.

In this embodiment, the color filter layer 206 is a color filter layer based on three primary colors including red (R), green (G), and blue (B). Specifically, the color filter layer 206 includes a green color filter 206a, a blue color filter 206b, and a red color filter 206c. The green color filter 206a transmits light in a wavelength range corresponding to green. The blue color filter 206b transmits light in a wavelength range corresponding to blue. The red color filter 206c transmits light in a wavelength range corresponding to red. The color filters of these colors are arranged in accordance with the Bayer arrangement so as to correspond to the pixels 211.

Nonetheless, a color filter layer 206 of a different mode may be adopted instead. In a modified example, the color filter layer 206 is a color filter based on complementary colors including cyan (C), magenta (M), and yellow (Y).

Meanwhile, the imaging device 200 includes an interlayer insulating layer 201 and the semiconductor substrate 210. The interlayer insulating layer 201 is located below the photoelectric conversion layer 203. The semiconductor substrate 210 is located below the interlayer insulating layer 201.

Figure 8:
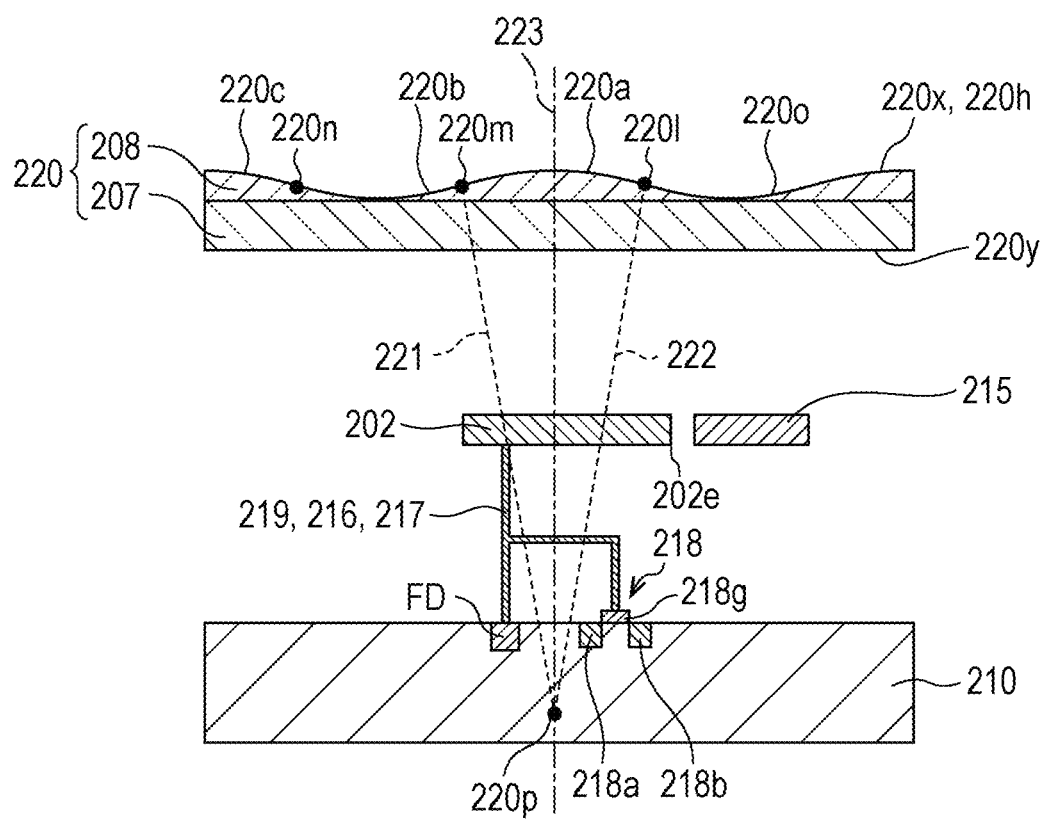
FIG. 8 is a schematic sectional view of the imaging device according to the embodiment.
Figure 8:
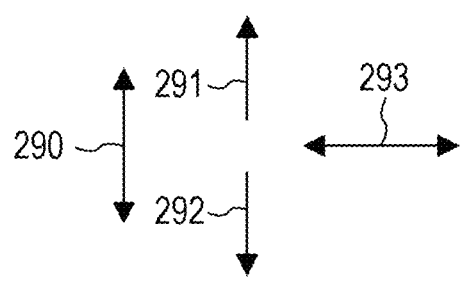

The semiconductor substrate 210 is provided with a charge accumulation region FD (see FIG. 8). The charge accumulation region FD is a diffusion region. The charge accumulation region FD is connected to the pixel electrodes 202. The charge accumulation region FD accumulates the electric charges sent from the pixel electrodes 202. Note that illustration of the charge accumulation region FD is omitted in FIG. 7.

Meanwhile, the semiconductor substrate 210 is provided with a signal detector 209. The signal detector 209 outputs a signal corresponding to the electric charges obtained by the photoelectric converter 212. The signal detector 209 is formed by combining two or more transistors such as CMOS transistors, for example.

In this embodiment, the signal detector 209 includes an amplifying transistor 218 (see FIG. 8). The amplifying transistor 218 generates a signal by using the aforementioned electric charges. To be more precise, a gate electrode 218g of the amplifying transistor 218 is connected to the charge accumulation region FD. The amplifying transistor 218 outputs the signal corresponding to the electric charges accumulated in the charge accumulation region FD.

In this embodiment, the signal detector 209 includes a reset transistor. The reset transistor resets the charge accumulation region FD. To be more precise, a source or a drain of the reset transistor forms the charge accumulation region FD in this embodiment.

In this embodiment, the pixel electrodes 202, the charge accumulation region FD, and the gate electrode 218g of the amplifying transistor 218 are connected to one another through an electrical path 219 as schematically illustrated in FIG. 8. The electrical path 219 includes at least one plug 216. Moreover, the electrical path 219 includes at least one set of wiring 217. Examples of the material of the plug 216 includes a metal, a semiconductor, and the like. The same applies to the material of the wiring 217. In a typical example, the amplifying transistor 218 is a metal oxide semiconductor field effect transistor (MOSFET). In the amplifying transistor 218 in FIG. 8, reference sign 218a is one of a source and a drain, and reference sign 218b is the other one of the source and the drain. Note that illustration of the reset transistor is omitted in FIG. 8.

Moreover, the imaging device 200 includes shield electrodes 215. The shield electrodes 215 are located away from the pixel electrodes 202. The shield electrodes 215 collect the electric charges generated by photoelectric conversion in the photoelectric conversion layer 203. In this way, the shield electrodes 215 can suppress noise contamination in the charge accumulation region FD.

To be more precise, the shield electrodes 215 are located below the photoelectric conversion layer 203. In other words, the shield electrodes 215 are located on the same side as the pixel electrodes 202 when viewed from the photoelectric conversion layer 203. Meanwhile, each shield electrode 215 is located between a pixel electrode 202 and another pixel electrode 202 adjacent thereto. Specifically, the shield electrode 215 spreads across a boundary between a pixel 211 and another pixel 211 adjacent thereto. The electric charges collected by the shield electrodes 215 are discharged through an electrical path that is electrically isolated from the electrical path 219 that connects the pixel electrodes 202 to the charge accumulation region FD. The above-described layout of the shield electrodes 215 is suitable for suppressing crosstalk between the adjacent pixels 211. In this way, the color imaging device 200 suppresses color mixture between the adjacent pixels 211.

In this embodiment, the photoelectric conversion layer 203 contains an organic material. To be more precise, the photoelectric conversion layer 203 is made of the organic material. In the photoelectric conversion layer 203, an n-type organic semiconductor may be bonded to a p-type organic semiconductor.

Nonetheless, the photoelectric conversion layer 203 may contain an inorganic material and may be formed from an inorganic material. Examples of the inorganic material include amorphous silicon, quantum dots, and the like.

The microlens 220 is provided above the photoelectric converter 212. Specifically, the microlens 220 is provided above the photoelectric conversion layer 203. To be more precise, the microlens 220 is provided above the color filter layer 206.

The microlens 220 includes lens portions 208 and a planar portion 207. Each lens portion 208 is connected to the planar portion 207. The lens portions 208 include an upper surface 220x of the microlens 220. The planar portion 207 includes a lower surface 220y of the microlens 220.

In this embodiment, each lens portion 208 is disposed corresponding to any one of the green color filter 206a, the blue color filter 206b, and the red color filter 206c.

In this embodiment, the material of the lens portions 208 is the same as the material of the planar portion 207. However, the material of the lens portions 208 may be different from the material of the planar portion 207.

Examples of the material of the microlens 220 include acrylic resin, a resin containing cyclohexane, and the like. The same applies to the material of the lens portions 208 and the material of the planar portion 207.

A refractive index of the lens portions 208 is in a range from about 1.2 to 1.7, for example.

In this embodiment, the planar portion 207 has a film shape. Accordingly, the planar portion 207 may also be referred to as a planarized film.

Figure 9A:
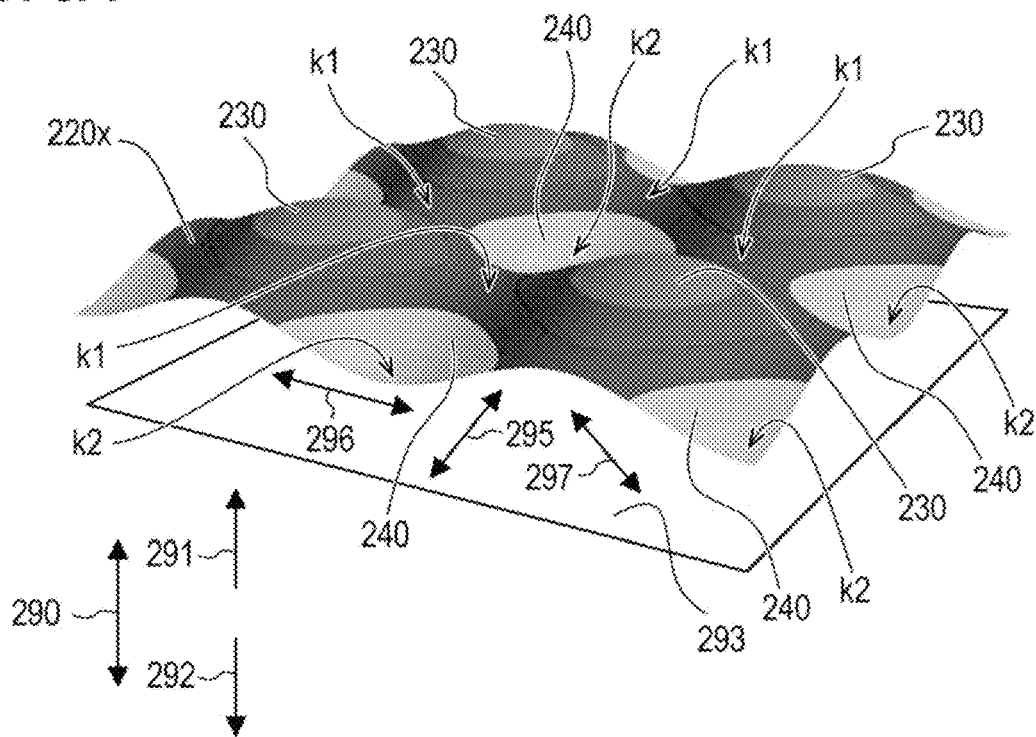
FIG. 9A is a perspective view illustrating an upper surface of a microlens according to the embodiment.
Figure 9B:
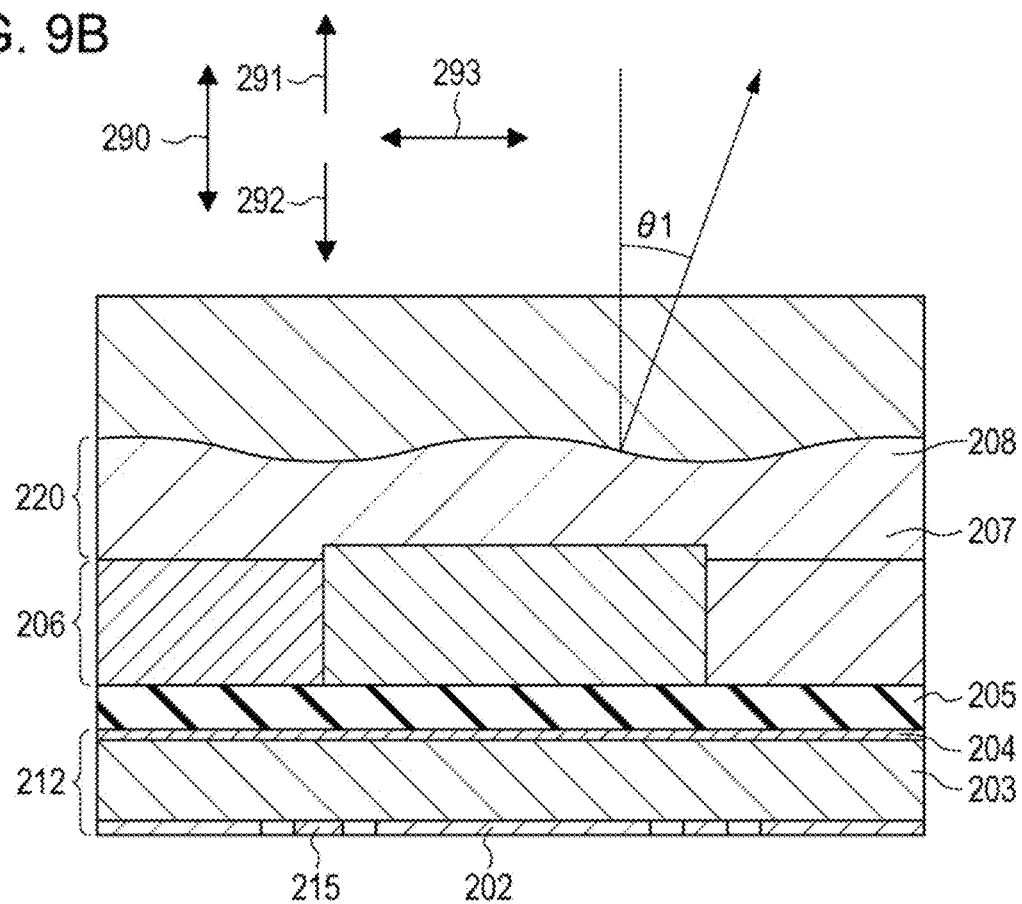
FIG. 9B is a sectional view illustrating the microlens according to the embodiment.
Figure 9C:
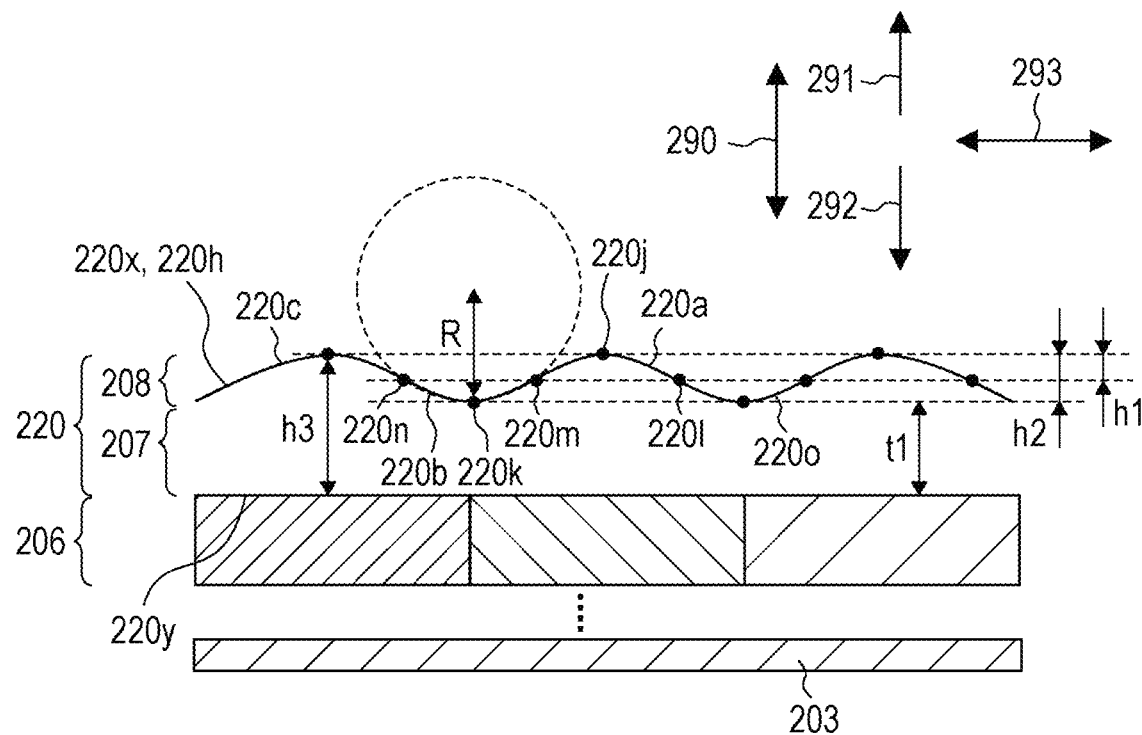
FIG. 9C is an explanatory diagram of the microlens according to the embodiment.
Figure 9D:
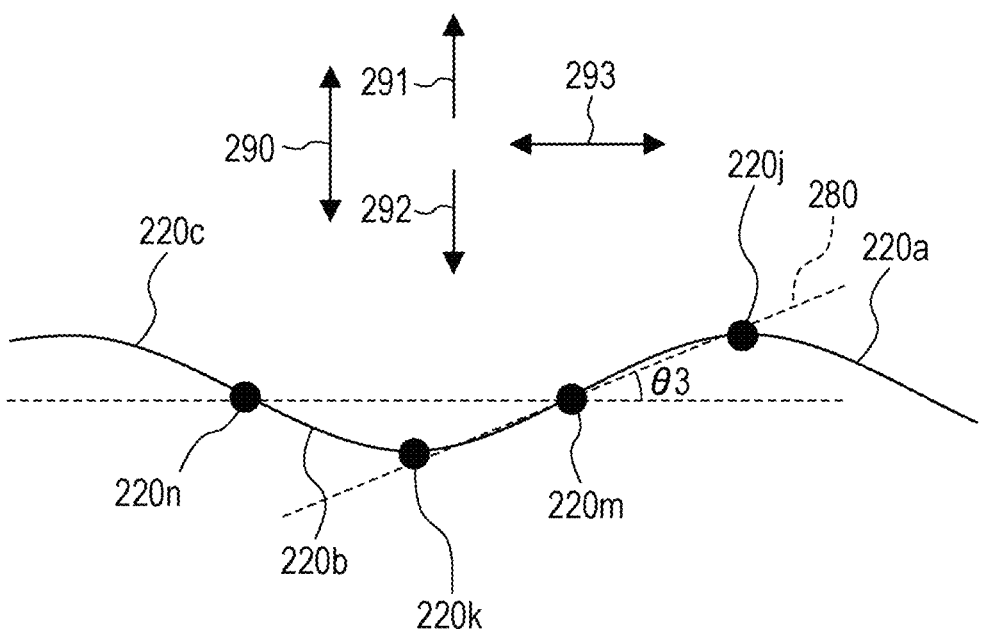
FIG. 9D is another explanatory diagram of the microlens according to the embodiment.

FIG. 9A is a perspective view of the upper surface 220x of the microlens 220. FIG. 9B is a sectional view of the microlens 220. FIG. 9C is an explanatory diagram of the cross-section of the microlens 220. FIG. 9D is a partially enlarged diagram of the FIG. 9C. FIGS. 9B and 9C also illustrate the color filter layer 206 and the like. Reference sign θ1 in FIG. 9B indicates an angle between a direction of incidence of the light and a direction of reflection thereof.

A cross-section of the imaging device 200 will be described below with reference to FIGS. 9A to 9D. Note that a term "specific cross-section" may be used in the following description for the convenience of explanation. Specifically, the specific cross-section spreads in an up-down direction 290 that corresponds to a thickness direction of the microlens 220.

FIG. 9C represents the specific cross-section. The imaging device 200 may include at least one specific cross-section. An arrow indicating an upward direction 291, an arrow indicating a downward direction 292, and an arrow indicating a horizontal direction 293 are indicated in FIGS. 9A to 9D. The horizontal direction 293 is a direction orthogonal to the up-down direction 290.

In this embodiment, the upper surface 220x of the microlens 220 forms a contour line 220h in the specific cross-section as illustrated in FIG. 9C. On the contour line 220h, a zeroth curve 220o that projects downward is connected to a first curve 220a that projects upward. This connection is established by the intermediary of a zeroth inflection point 2201. In other words, the zeroth inflection point 2201 is an inflection point between the zeroth curve 220o and the first curve 220a. On the contour line 220h, the first curve 220a that projects upward is connected to a second curve 220b that projects downward. This connection is established by the intermediary of a first inflection point 220m. In other words, the first inflection point 220m is an inflection point between the first curve 220a and the second curve 220b. Meanwhile, on the contour line 220h, the second curve 220b that projects downward is connected to a third curve 220c that projects upward. This connection is established by the intermediary of a second inflection point 220n. In other words, the second inflection point 220n is an inflection point between the second curve 220b and the third curve 220c. As described above, on the contour line 220h, the zeroth curve 220o, the first curve 220a, the second curve 220b, and the third curve 220c are connected in this order.

Now, a description will be given of the "inflection point" in this specification. In the example of FIG. 9C, the "inflection point" is a point where the curve changes from the state of projecting upward to the state of projecting downward or a point where the curve changes from the state of projecting downward to the state of projecting upward. Specifically, each of the zeroth inflection point 2201, the first inflection point 220m, and the second inflection point 220n is the point as described above.

However, in this specification, the "inflection point" is a concept that encompasses a connecting point between a curve and a segment. For this reason, in an example where the first curve 220a, a first segment, and the second curve 220b are connected in this order, a connecting point between the first curve 220a and the first segment may be deemed as an inflection point. Moreover, a connecting point between the first segment and the second curve 220b may be deemed as an inflection point.

A description will also be given of the expression "the contour line 220h on which the first curve 220a that projects upward is connected to the second curve 220b that projects downward by the intermediary of the first inflection point 220m". This expression encompasses an aspect in which the first curve 220a is directly connected to the second curve 220b at a single point. In this case, the single point serves as the first inflection point 220m. In the meantime, the above-mentioned expression also encompasses an aspect in which the first curve 220a is directly connected to one end of a segment and the second curve 220b is directly connected to the other end of the segment. In this case, a connecting point of the first curve 220a and the segment (that is, the one end of the segment mentioned above) is the first inflection point 220m. Meanwhile, in this case, a tangent to the contour line 220h at the first inflection point 220m in the specific cross-section may be a straight light that includes the segment.

Likewise, the expression "the first curve 220a is connected to the second curve 220b" is a concept that encompasses an aspect in which the first curve 220a is directly connected to the second curve 220b and an aspect in which the first curve 220a is connected to the second curve 220b by the intermediary of a segment. The expression "the first curve 220a, the second curve 220b, and the third curve 220c are connected in this order" is a concept that encompasses an aspect in which the curves are directly connected to one another and an aspect in which the adjacent curves are connected by the intermediary of a segment. The same applies to other similar expressions.

In the cross-section illustrated in FIG. 4B discussed earlier, a contour line 560h formed from an upper surface 560x of the microlens 560 is sharply bent into a V-shape at a lower end 560b thereof. In the cross-section illustrated in FIG. 4C, a curve 560a that projects upward is connected to a straight flat portion 560f on the contour line 560h. The cross-section illustrated in FIG. 9C is different from the cross-section in FIG. 4B and from the cross-section in FIG. 4C.

In this embodiment, the zeroth curve 220o, the first curve 220a, the second curve 220b, and the third curve 220c take on a sinusoidal shape. The sinusoidal shape can suppress reflection of the light at a large angle. However, these curves may take on other shapes such as an arc shape.

In this embodiment, a curvature radius R at a lower end 220k of the second curve 220b is larger than a distance h1 in the up-down direction 290 from an upper end 220j of the first curve 220a to the first inflection point 220m in the specific cross-section as illustrated in FIG. 9C. This structure is suitable for suppressing a flare. Specifically, the specific cross-section is the cross-section that spreads in the up-down direction 290 as mentioned earlier.

According to the structure having the relatively large curvature radius R, the light is less likely to be reflected at a large angle when the light traveling in the downward direction 292 is reflected from the microlens 220. In other words, the reflected light is less likely to travel in a direction close to the horizontal direction 293 (see results of optical simulations to be described later). For this reason, even when the light reflected from the microlens 220 is further reflected from an object located above the microlens 220, the light is less likely to be propagated far from a first position of incidence on the microlens 220 in terms of the horizontal direction 293. In other words, even when the light first made incident on the microlens 220 is reflected from the microlens 220 and develops stray light, the stray light is less likely to be propagated far away. As a consequence, the flare can be suppressed. The aforementioned object may be a transparent substrate made of glass and the like. Alternatively, the object may be a camera housing.

To be more precise, as compared to the curve that projects upward, the curve that projects downward is less likely to reduce its light collection performance even when the curvature radius is increased. For this reason, according to the structure having the relatively large curvature radius R, it is easier to ensure the light collection performance of the lens and to suppress the flare at the same time.

In this embodiment, the curvature radius R at the lower end 220k of the second curve 220b is larger than a distance h2 in the up-down direction 290 from the upper end 220j of the first curve 220a to the lower end 220k of the second curve 220b in the specific cross-section as illustrated in FIG. 9C. This structure is suitable for suppressing the flare.

In this embodiment, the curvature radius R at the lower end 220k of the second curve 220b is larger than a distance h3 in the up-down direction 290 from the upper end 220j of the first curve 220a to the lower surface 220y of the microlens 220 in the specific cross-section as illustrated in FIG. 9C. This structure is suitable for suppressing the flare.

In this embodiment, the curvature radius R at the lower end 220k of the second curve 220b is larger than a half of the distance h2 in the up-down direction 290 from the lower end 220k of the second curve 220b to the upper end 220j of the first curve 220a in the specific cross-section as illustrated in FIG. 9C. This structure is suitable for suppressing the flare. In light of the up-down direction 290, this structure may also be expressed as a structure in which the center of curvature at the lower end 220k of the second curve 220b is located above a midpoint between the lower end 220k and the upper end 220j.

In this embodiment, the curvature radius R at the lower end 220k of the second curve 220b is larger than the distance h2 in the up-down direction 290 from the lower end 220k of the second curve 220b to the upper end 220j of the first curve 220a in the specific cross-section as illustrated in FIG. 9C. This structure is suitable for suppressing the flare. In light of the up-down direction 290, this structure may also be expressed as a structure in which the center of curvature at the lower end 220k of the second curve 220b is located above the upper end 220j.

In this embodiment, the curvature radius R at the lower end 220k of the second curve 220b is smaller than a curvature radius at the upper end 220j of the first curve 220a in the specific cross-section.

However, the curvature radius R at the lower end 220k of the second curve 220b may be equal to the curvature radius at the upper end 220j of the first curve 220a in the specific cross-section. The curvature radius R at the lower end 220k of the second curve 220b may be larger than the curvature radius at the upper end 220j of the first curve 220a in the specific cross-section.

A ratio of the curvature radius R at the lower end 220k of the second curve 220b relative to the curvature radius at the upper end 220j of the first curve 220a is larger than or equal to 0.7 and smaller than or equal to 1.3, for example. This ratio may be larger than or equal to 0.8 and smaller than or equal to 1.2, or larger than or equal to 0.9 and smaller than or equal to 1.1.

In this embodiment, the curvature radius R at the lower end 220k of the second curve 220b is larger than 50 nm in the specific cross-section. This structure is suitable for suppressing the flare.

The curvature radius R may be larger than 300 nm. The curvature radius R may be larger than 500 nm. The curvature radius R is smaller than 10000 nm, for example. The curvature radius R may be smaller than 5000 nm. The curvature radius R may be smaller than or equal to 1200 nm. The curvature radius R is larger than 50 nm and smaller than 10000 nm, for example. The curvature radius R may be larger than 300 nm and smaller than 5000 nm. The curvature radius R may be larger than or equal to 500 nm and smaller than or equal to 1200 nm.

In this embodiment, a deflection angle θ3 of a direction of extension of a tangent 280 to the contour line 220h at the first inflection point 220m relative to the horizontal direction 293 is larger than 0 degrees and smaller than or equal to 35 degrees in the specific cross-section as illustrated in FIG. 9D. When the deflection angle θ3 is as small as this level, it is easy to smoothen the curves of the upper surface 220x of the microlens 220 as a whole. Accordingly, even if the light incident on the microlens 220 for the first time is reflected to develop the stray light, the stray light is less likely to be propagated far away. This structure is therefore suitable for suppressing the flare.

The deflection angle θ3 may be smaller than or equal to 30 degrees or smaller than or equal to 10 degrees. The deflection angle θ3 may be larger than or equal to 1 degrees or larger than or equal to 3 degrees.

In this embodiment, a dimension in the up-down direction 290 of the planar portion 207 is larger than the distance h2 in the up-down direction 290 from the upper end 220j to the lower end 220k in the specific cross-section as illustrated in FIG. 9C. It is easy to manufacture the microlens having the aforementioned characteristic. For this reason, according to this embodiment, it is easy to ensure reliability of the imaging device. The dimension in the up-down direction 290 of the planar portion 207 is a thickness t1.

However, the dimension in the up-down direction 290 of the planar portion 207 may be equal to the distance h2 in the up-down direction 290 from the upper end 220j to the lower end 220k in the specific cross-section. Alternatively, the dimension in the up-down direction 290 of the planar portion 207 may be smaller than the distance h2 in the up-down direction 290 from the upper end 220j to the lower end 220k in the specific cross-section.

In this embodiment, the first curve 220a, the second curve 220b, and the third curve 220c are connected in this order in the contour line 220h in the specific cross-section as illustrated in FIG. 9C. In the specific cross-section, the first curve 220a, the second curve 220b, and the third curve 220c overlap the photoelectric conversion layer 203 when viewed from above. This structure is suitable for performing efficient photoelectric conversion of the light incident on the imaging device 200 while suppressing the flare.

A reason why this structure is suitable for performing efficient photoelectric conversion of the incident light while suppressing the flare can be described as follows.

Specifically, in the example of FIG. 4B, the contour line 560h formed from the upper surface 560x of the microlens 560 is sharply bent into the V-shape at the lower end 560b thereof, in the cross-section illustrated in FIG. 4B. On the other hand, the second curve 220b is present in the example of FIG. 9C. As understood from the explanations mentioned above, according to the structure where the second curve 220b is present, the reflection of the light at a large angle may be suppressed when the light that travels in the downward direction 292 is reflected from the microlens 220. Accordingly, even if the light incident on the microlens 220 for the first time is reflected from the microlens 220 to develop the stray light, the stray light is less likely to be propagated far away. The flare may be suppressed for this reason.

However, on the condition that the heights in the up-down direction 290 of the lens portions 561 and 208 of the microlenses 560 and 220 are equal, the structure of FIG. 9C may be disadvantageous as compared to the structure of FIG. 4B from the viewpoint of ensuring light collection performances of the lens portions. To be more precise, the contour line 560h in FIG. 4B is sharply bent into the V-shape at the lower end 560b thereof. In this case, a deflection angle of a direction of extension of a tangent to the curve 560a that projects upward relative to the horizontal direction tends to grow large in the course of reaching from an upper end of the curve 560a to the lower end 560b thereof (note that the lower end 560b is a lower end of the lens portion 561 in the example of FIG. 4B). The large deflection angle is advantageous from the viewpoint of ensuring the light collection performances of the first curve 220a and the third curve 220c. In contrast, in the example of FIG. 9C, the second curve 220b that projects downward is connected to the first curve 220a that projects upward. In this case, a deflection angle of a direction of extension of a tangent to the first curve 220a relative to the horizontal direction 293 does not tend to grow large in the course of reaching from the upper end 220j of the first curve 220a to the first inflection point 220m (note that the first inflection point 220m is located above the lower ends of the lens portions 208 in the example of FIG. 9C). The deflection angle remaining in a small range is disadvantageous from the viewpoint of ensuring the light collection performances of the first curve 220a and the third curve 220c. Nevertheless, this embodiment adopts such a structure that enables efficient photoelectric conversion of the light incident on the imaging device 200. This point will be described below.

An assumption is made herein that a small first photoelectric conversion layer is disposed below the first curve 220a, that a small second photoelectric conversion layer is disposed below the third curve 220c, that the first curve 220a is designed to refract the light so as to cause the first photoelectric conversion layer to collect the light, and that the third curve 220c is designed to refract the light so as to cause the second photoelectric conversion layer to collect the light. Here, the first photoelectric conversion layer and the second photoelectric conversion layer are located away from each other. If the light collection performance is low in that case, part of the light is guided to a gap between the photoelectric conversion layers instead of the photoelectric conversion layers, and the light incident on the imaging device may not be efficiently subjected to the photoelectric conversion. On the other hand, in the example of FIG. 9C, the first curve 220a, the second curve 220b, and the third curve 220c overlap the single photoelectric conversion layer 203 in the specific cross-section when viewed from above. According to this structure, the light can reach the photoelectric conversion layer 203 even in the case of low light collection performances of the first curve 220a and the third curve 220c. As a consequence, the light incident on the imaging device 200 can be subjected to the efficient photoelectric conversion.

Strictly speaking, in the present embodiment, the entirety of the first curve 220a, the entirety of the second curve 220b, and the entirety of the third curve 220c overlap the photoelectric conversion layer 203 in the specific cross-section when viewed from above.

In this embodiment, the first curve 220a, the second curve 220b, and the third curve 220c can be regarded as fitting inside two ends in the horizontal direction 293 of the photoelectric conversion layer 203 in the specific cross-section. When the first curve 220a, the second curve 220b, and the third curve 220c fit inside the two ends of the single photoelectric conversion layer 203, the light can reach the photoelectric conversion layer 203 even in the case of low light collection performances of the first curve 220a and the third curve 220c. Strictly speaking, in this embodiment, the entirety of the first curve 220a, the entirety of the second curve 220b, and the entirety of the third curve 220c fit inside the two ends in the horizontal direction 293 of the photoelectric conversion layer 203 in the specific cross-section.

In this embodiment, each of FIGS. 7 and 8 also illustrates the specific cross-section.

In this embodiment, a focal point 220p of the first curve 220a is located below the gate electrode 218g of the amplifying transistor 218 in the specific cross-section as illustrated in FIG. 8.

In this embodiment, a first segment 221 that connects the first inflection point 220m corresponding to one end of the first curve 220a to the focal point 220p and a second segment 222 that connects the zeroth inflection point 220l corresponding to the other end of the first curve 220a to the focal point 220p intersect the pixel electrode 202 in the specific cross-section. According to this structure, the pixel electrode 202 can suppress an adverse effect of the light incident on the first curve 220a on an element present below the pixel electrode 202. This structure is advantageous from the viewpoint of reducing noise.

In this embodiment, the focal point 220p of the first curve 220a is located below the gate electrode 218g of the amplifying transistor 218 as described above. When the focal point 220p is located at this position, the light being gradually collected and traveling downward may reach the amplifying transistor 218. The light reaching the amplifying transistor 218 may affect the amplifying transistor 218 and cause the noise. However, when the first segment 221 and the second segment 222 intersect the pixel electrode 202, the intensity of the light reaching the amplifying transistor 218 may be reduced. Accordingly, the noise reduction action as described above may come into being when the focal point 220p is located below the gate electrode 218g.

In this embodiment, each pixel electrode 202 contains at least one selected from the group consisting of a metal and a metal compound. The pixel electrode 202 having the above-described noise reduction action may be structured in this way.

In this embodiment, the pixel electrode 202 contains a metal. This makes it easier to form the pixel electrode 202 that has the above-described noise reduction action.

In this embodiment, each pixel electrode 202 contains a material having a light transmission property lower than that of the interlayer insulating layer 201 and/or having a light transmission property lower than that of indium tin oxide (ITO). This characteristic may also be advantageous for ensuring the above-described noise reduction action.

In this embodiment, a focal distance f of each lens portion 208 of the microlens 220 is expressed by the following formula (1):

$$f=\{n1/(n1-n0)\}r \qquad (1).$$

Here, r is a curvature radius of the lens portion 208, n1 is a refractive index of the material of the lens portion 208, and n0 is a refractive index of a medium in contact with a light incident side of the lens portion. In short, the formula (1) expresses the focal distance f of the lens portion 208 when the light is made incident from the medium (such as an air layer) having the refractive index n0 onto the lens portion 208 having the refractive index n1 and the curvature radius r.

As described above, the expression "the focal distance of the first curve 220a" is used in this embodiment. The focal distance of the first curve 220a means the focal distance derived based on the formula (1). As understood from the formula (1), the focal distance of the first curve 220a takes into account not only the shape of the first curve 220a but also the materials of the lens portion 208 and the like.

In this embodiment, the focal point 220p of the first curve 220a is located away from the gate electrode 218g of the amplifying transistor 218 in the specific cross-section when viewed from above. In other words, the focal point 220p of the first curve 220a is not superposed on the gate electrode 218g of the amplifying transistor 218 in the specific cross-section when viewed from above. According to this structure, the light incident on the first curve 220a is less likely to affect the amplifying transistor 218. This feature is advantageous from the viewpoint of reducing the noise. Here, the expression "when viewed from above" can be translated to "in plan view". The "plan view" means a view along the thickness direction of the semiconductor substrate 210.

In this embodiment, the gate electrode 218g of the amplifying transistor 218 is located outside of a region between the first segment 221 and the second segment 222 in the specific cross-section. According to this structure, the light incent on the first curve 220a is less likely to affect the amplifying transistor 218. This feature is advantageous from the viewpoint of reducing the noise.

In this embodiment, a reference straight line 223 passes through the pixel electrode 202 in the specific cross-section as illustrated in FIG. 8. The reference straight line 223 is a line that passes through the upper end 220j of the first curve 220a and extends in the up-down direction 290 in the specific cross-section. In the specific cross-section, the shield electrode 215 is located outside of an outer end 202e of the pixel electrode 202 when viewed from the reference straight line 223. According to this structure, the shield electrode 215 can suppress crosstalk. Moreover, the first curve 220a can avoid a circumstance in which the shield electrode 215 excessively collects the electric charges.

In this embodiment, as illustrated in FIG. 9A, the upper surface 220x of the microlens 220 includes multiple first curved surfaces 230 that project upward and multiple second curved surfaces 240 that project downward. Directions of arrangement of the multiple first curved surfaces 230 projecting upward and directions of arrangement of the multiple second curved surfaces 240 projecting downward each include a longitudinal direction 295, a lateral direction 296, and an oblique direction 297. Here, a cross-section that spreads in the up-down direction 290 and the longitudinal direction 295 will be defined as a longitudinal cross-section. A cross-section that spreads in the up-down direction 290 and the lateral direction 296 will be defined as a lateral cross-section. A cross-section that spreads in the up-down direction 290 and the oblique direction 297 will be defined as an oblique cross-section. In this case, at least one selected from the group consisting of the longitudinal cross-section, the lateral cross-section, and the oblique cross-section corresponds to the specific cross-section.

In this embodiment, the longitudinal direction 295, the lateral direction 296, and the oblique direction 297 belong to the horizontal direction 293 as illustrated in FIG. 9A. The longitudinal direction 295, the lateral direction 296, and the oblique direction 297 are directions that are different from one another. In a typical example, the longitudinal direction 295 and the lateral direction 296 are orthogonal to each other, and the oblique direction 297 is a direction shifted by 45 degrees from each of the longitudinal direction 295 and the lateral direction 296.

In this embodiment, the first curve 220a that projects upward belongs to one of the multiple first curved surfaces 230 that project upward. The third curve 220c that projects upward belongs to one of the multiple first curved surfaces 230 that project upward. The second curve 220b that projects downward belongs to one of the multiple second curved surfaces 240 that project downward.

In this embodiment, the longitudinal cross-section and/or the lateral cross-section, as well as the oblique cross-section correspond to the specific cross-section as illustrated in FIG. 9A. The lower end 220k in the oblique cross-section is located below the lower end 220k in the longitudinal cross-section and/or the lateral cross-section.

In FIG. 9A, reference sign k1 denotes a portion that may correspond to the lower end 220k in the longitudinal cross-section and to the lower end 220k in the lateral cross-section. Reference sign k2 denotes a portion that may correspond to the lower end 220k in the oblique cross-section.

In this embodiment, it is also possible to deem that at least one specific cross-section includes at least one selected from the group consisting of the longitudinal cross-section, the lateral cross-section, and the oblique cross-section. Meanwhile, it is also possible to deem that at least one specific cross-section includes the longitudinal cross-section and/or the lateral cross-section, as well as the oblique cross-section.

In this embodiment, the multiple pixel electrodes 202 are arranged in a row direction and a column direction, thereby forming an array. The row direction may correspond to one of the longitudinal direction 295 and the lateral direction 296. The column direction may correspond to the other one of the longitudinal direction 295 and the lateral direction 296. A cross-section that spreads in the up-down direction 290 and in the row direction will be defined as a first cross-section. A cross-section that spreads in the up-down direction 290 and in the column direction will be defined as a second cross-section. In this case, the first cross-section may correspond to the specific cross-section. The second cross-section may correspond to the specific cross-section.

The photoelectric converter may be a photodiode. The photodiode is formed in the semiconductor substrate, for example. Even when the photoelectric converter is the photodiode, the imaging device can be formed in conformity to the case where the photoelectric converter includes the counter electrode 204, the pixel electrodes 202, and the photoelectric conversion layer 203.

A description will be given of a specific example in the case where the photoelectric converter is the photodiode. In this specific example, the multiple photodiodes are arranged in the row direction and the column direction, thereby forming an array. The row direction may correspond to one of the longitudinal direction 295 and the lateral direction 296. The column direction may correspond to the other one of the longitudinal direction 295 and the lateral direction 296. A cross-section that spreads in the up-down direction 290 and in the row direction will be defined as a third cross-section. A cross-section that spreads in the up-down direction 290 and in the column direction will be defined as a fourth cross-section. In this case, the third cross-section may correspond to the specific cross-section. The fourth cross-section may correspond to the specific cross-section.

Figure 10:
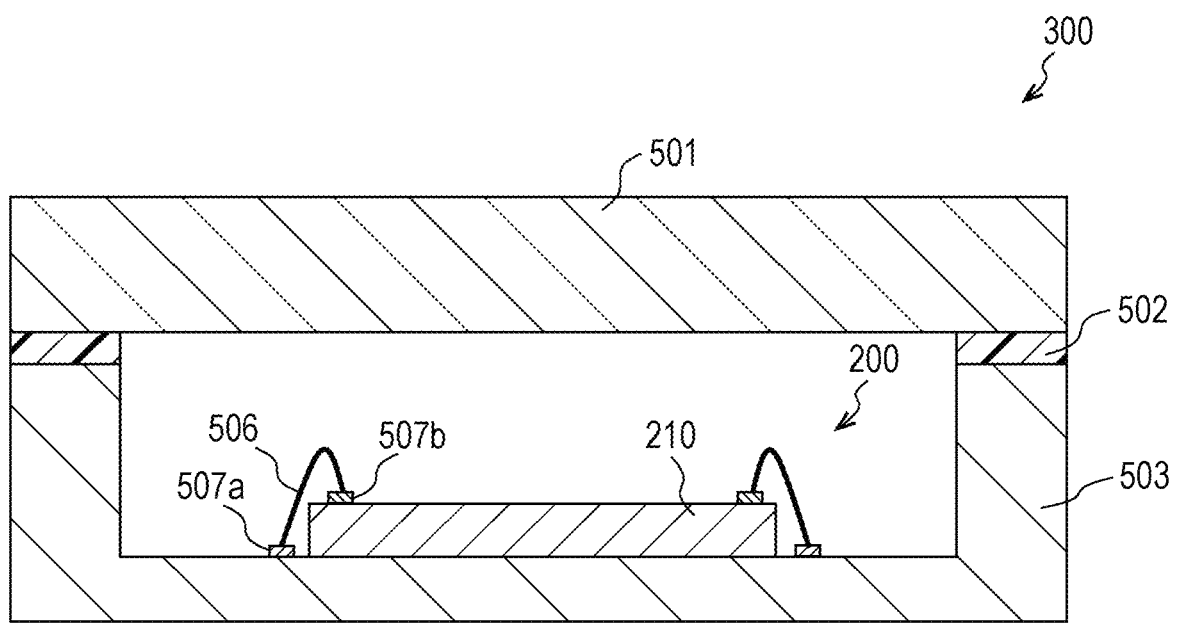
FIG. 10 is a schematic diagram illustrating an imaging system according to the embodiment.

FIG. 10 illustrates an imaging system 300 according to this embodiment. The imaging system 300 includes the transparent substrate 501, the resin layer 502, the package 503, the imaging device 200, the wiring 507a, and the bonding wires 506.

The transparent substrate 501, the resin layer 502, and the package 503 are the same as those described with reference to FIG. 1. The imaging device 200 is the same as the one described with reference to FIGS. 7 to 9D. Note that illustration of some elements is omitted in FIG. 10.

The imaging device 200 is connected to the wiring 507a by using the bonding wires 506. Specifically, the bonding wires 506 connect the wiring 507b of the imaging device 200 to the wiring 507a. The wiring 507b in FIG. 10 schematically illustrates the wiring that is present on the upper part of the imaging device 200. Illustration of the wiring 507b is omitted in FIG. 7.

A description will be given below of optical simulations conducted in order to verify a relation between the shape of the microlens and the degree of the flare.

Optical Simulation 1

Figure 11:
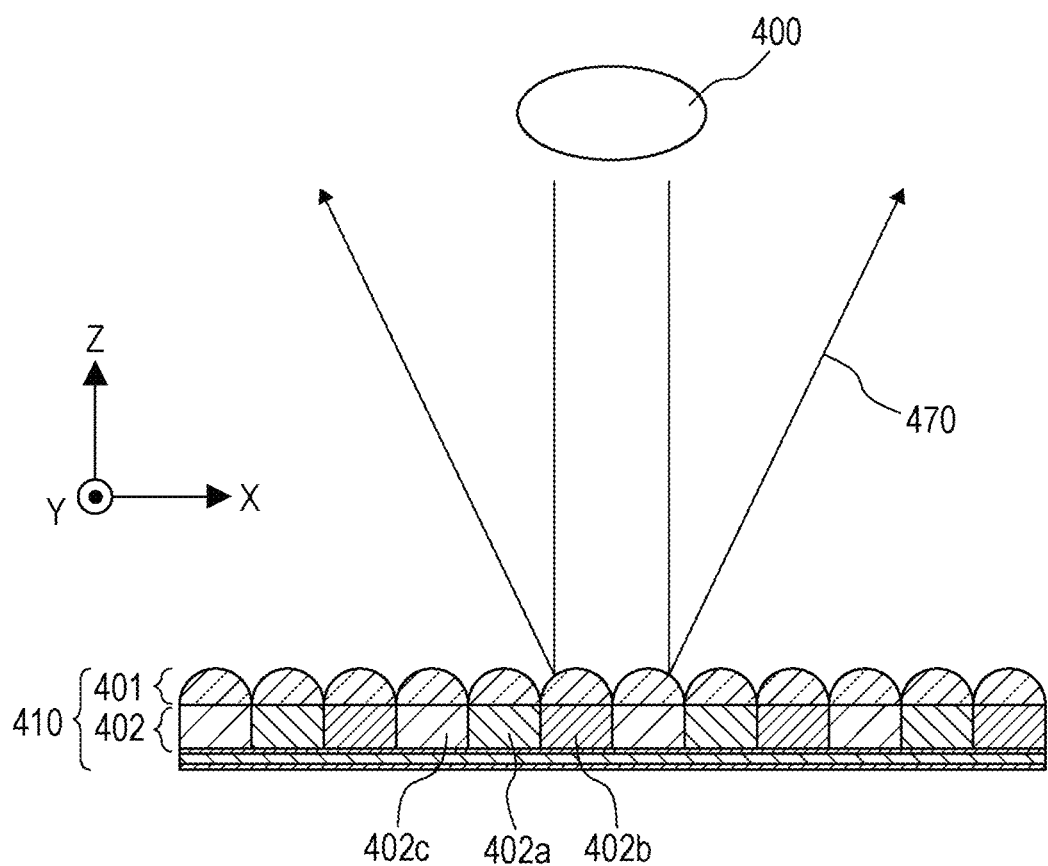
FIG. 11 is a conceptual diagram of a simulation space.

FIG. 11 illustrates a conceptual diagram of a simulation space of an optical simulation 1. Here, x axis, y axis, and z axis that are orthogonal to one another are set in the optical simulation 1. FIG. 11 schematically illustrates x-z plane in the simulation space, which passes through the center in the y axis direction. Note that y-z plane in the simulation space, which passes through the center in the x axis direction also has substantially the same structure as that illustrated in FIG. 11. In FIG. 11, an arrow 470 indicates a direction of travel of the light.

A dimension in the x axis direction of the simulation space is set to 200 µm. A dimension in the y axis direction of the simulation space is set to 200 µm. A dimension in the z axis direction of the simulation space is set to 40 µm. A boundary condition of the simulation space is set to an open boundary.

A light source 400 and an optical element 410 are simulated in the simulation space.

The light source 400 is simulated by setting a circular planar region having a radius of 15 µm on the x-y plane that passes through one end in the z axis direction in the simulation space, in which uniform light having a wavelength of 530 nm is emitted. The light having the wavelength of 530 nm corresponds to green light. In the following description, the x-y plane that passes through the one end in the z axis direction in the simulation space may be referred to as a plane including the light source 400.

The optical element 410 is disposed along the x-y plane that passes through the other end in the z axis direction in the simulation space. In the optical element 410, an organic film, an ITO layer, an $Al_2O_3$ layer, a SiON layer, a color filter layer 402, and a microlens 401 are stacked in this order. The organic film corresponds to the photoelectric conversion layer. The ITO layer corresponds to the counter electrode. The combination of the $Al_2O_3$ layer and the SiON layer corresponds to the protective layer. The color filter layer 402 includes a green color filter 402a, a blue color filter 402b, and a red color filter 402c.

To be more precise, the optical element 410 is disposed such that the microlens 401 faces the light source 400. A distance between the plane including the light source 400 and a position of an upper surface of the microlens 401 located closest to the above-mentioned plane is set to 40 µm. A cell size is set to 3 µm. Here, the cell size being set to 3 µm means that a dimension in the x direction of each pixel is equal to 3 µm and a dimension in the y direction thereof is equal to 3 µm. Each of the green color filter 402a, the blue color filter 402b, and the red color filter 402c has the same dimensions as those of the cell size.

Figure 12A:
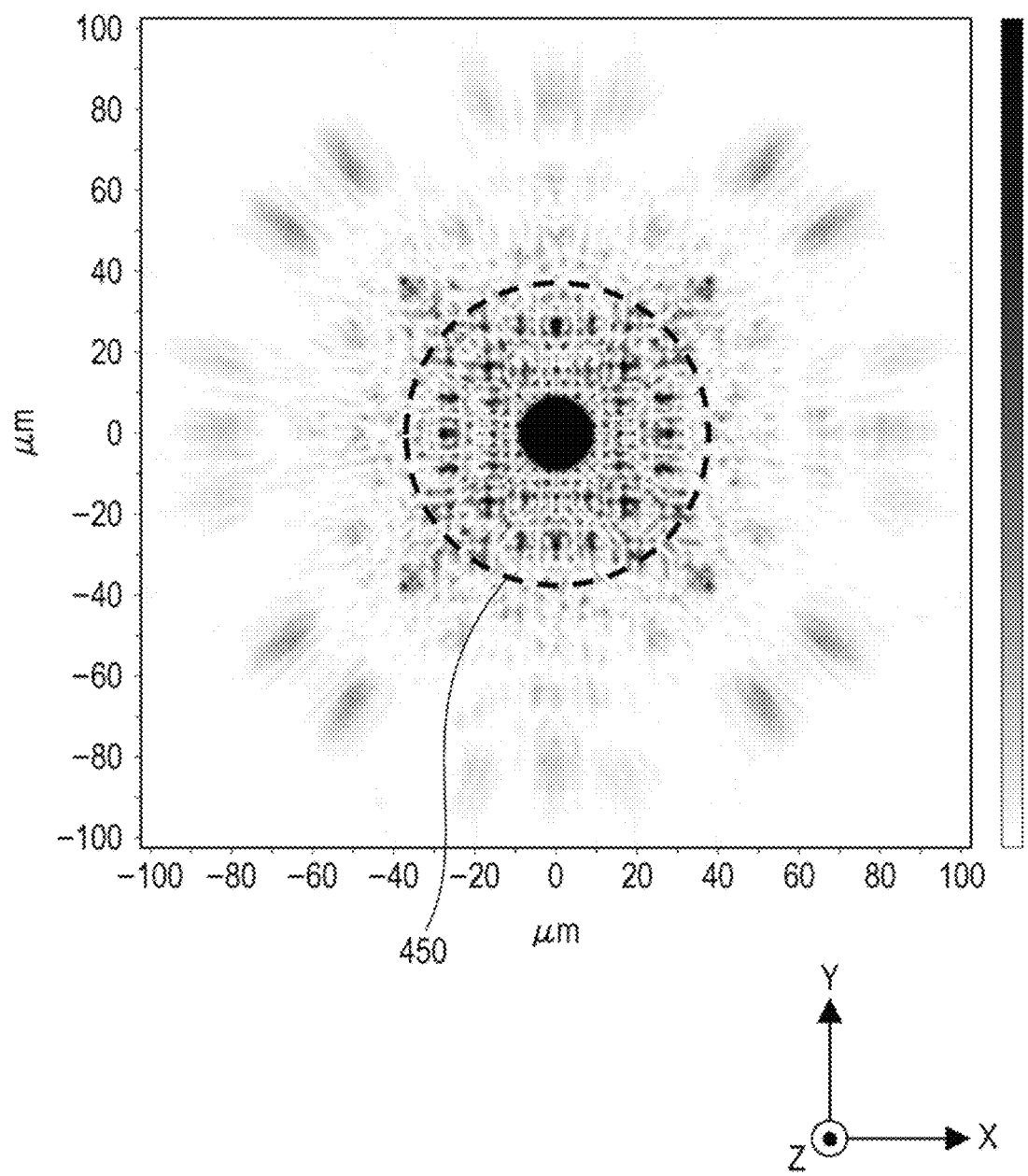
FIG. 12A is a diagram illustrating light intensity distribution calculated in accordance with an optical simulation 1.

The microlens 401 in the optical simulation 1 corresponds to the microlens 560 of the aspect for reference described with reference to FIGS. 4A to 4C. Therefore, optical characteristics of the microlens 560 of the aspect for reference can be evaluated by the optical simulation 1. To be more precise, in the optical simulation 1, light intensity distribution on the plane including the light source 400 is calculated in accordance with a wave motion analysis. A result of calculation is depicted in FIG. 12A.

Optical Simulation 2

In an optical simulation 2, the microlens 401 is not the microlens 560 of the aspect for reference, but instead corresponds to the microlens 220 of the embodiment described with reference to FIGS. 9A to 9D. Regarding other conditions, the optical simulation 2 is conducted as with the optical simulation 1. To be more precise, in the optical simulation 2, the curvature radius R at the lower end 220k of the second curve 220b is set to 1200 nm. The distance h1 in the up-down direction 290 from the upper end 220j of the first curve 220a to the first inflection point 220m is set to 200 nm. The distance h2 in the up-down direction 290 from the upper end 220j of the first curve 220a to the lower end 220k of the second curve 220b is set to 400 nm. The distance h3 in the up-down direction 290 from the upper end 220j of the first curve 220a to the lower surface 220y of the microlens 220 is set to 750 nm. The curvature radius at the upper end

220j of the first curve 220a is set to 1200 nm. The deflection angle θ3 of the direction of extension of the tangent 280 to the contour line 220h at the first inflection point 220m relative to the horizontal direction 293 is set to 22.7 degrees. In the optical simulation 2 as well, light intensity distribution on the plane including the light source 400 is calculated in accordance with the wave motion analysis. A result of calculation is depicted in FIG. 12B.

Figure 12B:
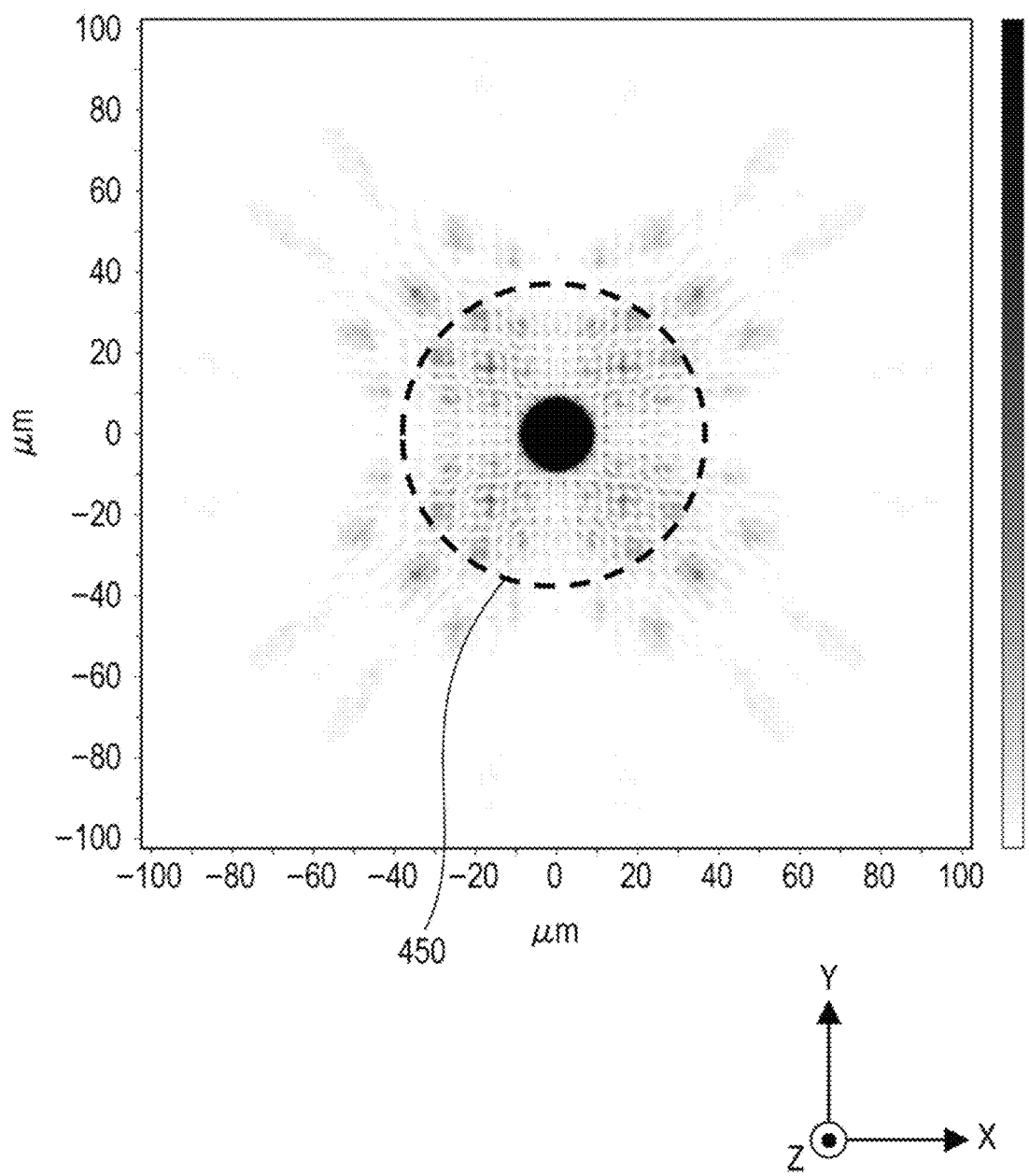
FIG. 12B is a diagram illustrating light intensity distribution calculated in accordance with an optical simulation 2.

Each of FIGS. 12A and 12B is a color map. In FIGS. 12A and 12B, a portion having a thick color represents a portion having high light intensity. Each of FIGS. 12A and 12B is provided with a dashed line circle 450. In each of FIGS. 12A and 12B, there is a circular region with a thick color at a central portion in the dashed line circle 450. Regarding a surrounding portion that surrounds the central portion in the dashed line circle 450, FIG. 12B depicts less regions with the thick color as compared to FIG. 12A.

When the imaging system is constructed as illustrated in FIGS. 1 and 10, the light reflected from the microlens may further be reflected from the transparent substrate 501 and the like, and travel toward the microlens again in reality. In this way, the flare is likely to occur. However, as understood from FIGS. 12B and 12A, the light is less likely to be reflected at a large angle from the microlens 220 in the embodiment as compared to the aspect for reference. For this reason, the light is less likely to be propagated far from the first position of incidence on the microlens. Accordingly, the microlens 220 of the embodiment can suppress the flare.

As mentioned earlier, in FIG. 12B, there is the circular region with the thick color at the central portion in the dashed line circle 450. However, this phenomenon does not necessarily mean that the flare also occurs when using the microlens 220 of the embodiment described with reference to FIGS. 9A to 9D. In a typical example, an actual light source has a larger size in the horizontal direction 293 than that of the light source 400 used in the simulation, and the light reflected immediately above the microlens 220 is absorbed by the light source. As a consequence, the light reflected immediately above the microlens 220 is less likely to cause the flare. To be more precise, the light reflected immediately above the microlens may further be reflected from the transparent substrate 501 and the like, and travel toward the microlens again in reality. As a consequence of this repeated reflection, the light may be propagated to a position which is far from the first position of incidence on the microlens 220 to some extent. Nevertheless, in the imaging system including the optical system corresponding to the optical simulation 2, such a propagation range is limited. As a consequence, it is considered that the light source in the typical size can sufficiently absorb the propagated light and does not cause a flare that becomes a problem.

On the other hand, in FIG. 12A, the presence of many regions with the thick colors at the surrounding portion in the dashed line circle 450 corresponds to a situation where the light reflected at a large angle from the microlens has high intensity. In other words, this aspect corresponds to a situation where the angle θ2 illustrated in FIG. 4B is large and the light being reflected from the microlens and traveling in the direction close to the horizontal direction has the high intensity. In this situation, the light is propagated far from the first position of incidence on the microlens, thereby causing the flare.

As described above, when the angle θ2 illustrated in FIG. 4B is large, the light is propagated far from the first position of incidence on the microlens, thereby causing the flare. Moreover, in that case, the light may be incident on the color filter layer and the photoelectric converter at the far position and at a large angle (that is, a large incident angle). Accordingly, a red or blue flare may occur instead of a white flare. However, the microlens 220 according to the embodiment can also suppress such a colored flare. This aspect will be described below in detail with reference to FIG. 13.

Figure 13:
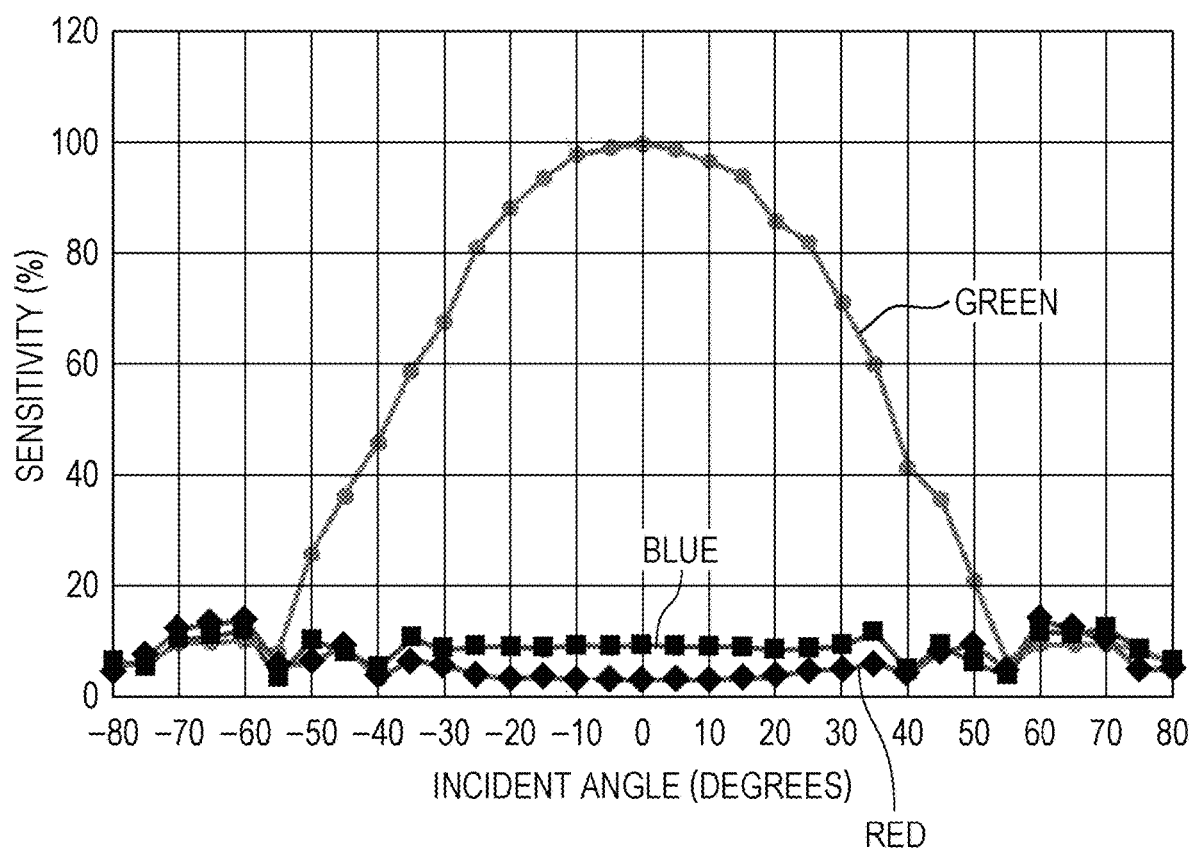
FIG. 13 is a graph plotting an example of a relation between incident light and sensitivity of respective colors.

FIG. 13 illustrates an example of a relation between an incident angle of green light made incident on the color filter layer as well as the photoelectric converter and sensitivity in terms of green, read, and blue colors. In FIG. 13, the horizontal axis represents the incident angle (unit: degrees) and the vertical axis represents the sensitivity. Here, the incident angle is assumed to be equal to 0 degrees when the light is incident perpendicularly onto principal surfaces of the color filter layer and the photoelectric converter. The sensitivity plotted in FIG. 13 represents normalized sensitivity, in which the sensitivity of each color is normalized while setting the sensitivity of the green color to 100% when the incident angle of the light is equal to 0 degrees. In the example of FIG. 13, each of the sensitivity of the red color and the sensitivity of the blue color grows larger as compared to the sensitivity at the incident angle of 0 degrees when the incident angle becomes larger than some 55 degrees. This phenomenon means that magenta coloring emerges when the incident angle becomes larger than some 55 degrees. However, according to the microlens 220 of the embodiment, it is possible to reduce the intensity of the light reflected at a large angle from the microlens 220, and thus to reduce the intensity of the light that reapproaches the color filter layer and the photoelectric converter at a large angle. Thus, the colored flare can be suppressed.

Other Embodiments

The imaging device 200 illustrated in FIG. 7 includes the color filter layer 206 located between the photoelectric converter 212 and the microlens 220. However, the color filter layer 206 is always essential.

Meanwhile, the imaging device 200 illustrated in FIG. 7 includes just one photoelectric converter 212 located between the semiconductor substrate 210 and the microlens 220. Instead, two or more photoelectric converters may be provided between the semiconductor substrate 210 and the microlens 220.

In the meantime, the imaging device 200 illustrated in FIG. 7 constitutes a front-illuminated sensor. Instead, the imaging device may constitute a back-illuminated sensor.

The imaging device of the present disclosure is, for example, applicable to cameras such as a digital camera and an in-vehicle camera.

What is claimed is:

1. An imaging device comprising:
   a photoelectric converter; and
   a microlens provided above the photoelectric converter, wherein
   in a cross-section of the imaging device,
      an upper surface of the microlens forms a contour line in which a first curve projecting upward is connected to a second curve projecting downward at a first inflection point located between the first curve and the second curve, and
      a curvature radius of the second curve at a lower end of the second curve is larger than a distance in a thickness direction of the microlens from an upper end of the first curve to the first inflection point.

2. The imaging device according to claim 1, wherein the curvature radius of the second curve at the lower end of the second curve is larger than a distance in the thickness direction from the upper end to the lower end in the cross-section.

3. The imaging device according to claim 1, wherein the curvature radius of the second curve at the lower end of the second curve is larger than a distance in the thickness direction from the upper end to a lower surface of the microlens in the cross-section.

4. The imaging device according to claim 1, further comprising:
an amplifying transistor including a gate electrode, wherein
a focal point of the first curve is located below the gate electrode in the cross-section.

5. The imaging device according to claim 4, wherein the photoelectric converter includes
a photoelectric conversion layer that converts light into electric charges, and
a pixel electrode that collects the electric charges, and
a first segment that connects a first end of the first curve to the focal point and a second segment that connects a second end of the first curve to the focal point intersect the pixel electrode in the cross-section.

6. The imaging device according to claim 5, wherein the pixel electrode contains at least one selected from the group consisting of a metal and a metal compound.

7. The imaging device according to claim 1, further comprising:
an amplifying transistor including a gate electrode, wherein
a focal point of the first curve is located away from the gate electrode in plan view.

8. The imaging device according to claim 1, wherein the photoelectric converter includes
a photoelectric conversion layer that converts light into electric charges, and
a pixel electrode that collects the electric charges,
the imaging device further includes a shield electrode that is located away from the pixel electrode and that collects the electric charges,
in the cross-section,
a reference straight line passing through the upper end and extending in the thickness direction passes through the pixel electrode, and
the shield electrode is located outside of an outer end of the pixel electrode when viewed from the reference straight line.

9. The imaging device according to claim 1, wherein the curvature radius of the second curve at the lower end of the second curve is smaller than a curvature radius of the first curve at the upper end of the first curve in the cross-section.

10. The imaging device according to claim 1, wherein the curvature radius of the second curve at the lower end of the second curve is larger than 50 nm in the cross-section.

11. The imaging device according to claim 1, wherein a deflection angle of a direction of extension of a tangent to the contour line at the first inflection point relative to a horizontal direction being orthogonal to the thickness direction is larger than 0 degrees and smaller than or equal to 35 degrees in the cross-section.

12. The imaging device according to claim 1, wherein the microlens includes
a lens portion including the upper surface, and
a planar portion connected to the lens portion, and
a dimension in the thickness direction of the planar portion is larger than a distance in the thickness direction from the upper end to the lower end in the cross-section.

13. The imaging device according to claim 1, wherein
the photoelectric converter includes a photoelectric conversion layer that converts light into electric charges,
the first curve, the second curve, and a third curve projecting upward are connected in this order in the contour line in the cross-section, and
the first curve, the second curve, and the third curve overlap the photoelectric conversion layer in plan view.

14. The imaging device according to claim 1, wherein the upper surface includes
a plurality of first curved surfaces each projecting upward, and
a plurality of second curved surfaces each projecting downward,
directions of arrangement of the plurality of first curved surfaces and directions of arrangement of the plurality of second curved surfaces each include a longitudinal direction, a lateral direction, and an oblique direction, and
when the cross-section is referred to as a specific cross-section, at least one selected from the group consisting of a longitudinal cross-section spreading in the thickness direction and the longitudinal direction, a lateral cross-section spreading in the thickness direction and the lateral direction, and an oblique cross-section spreading in the thickness direction and the oblique direction corresponds to the specific cross-section.

15. The imaging device according to claim 14, wherein the oblique cross-section corresponds to the specific cross-section.

16. The imaging device according to claim 14, wherein
the oblique cross-section and at least one selected from the group consisting of the longitudinal cross-section and the lateral cross-section each correspond to the specific cross-section, and
the lower end in the oblique cross-section is located below the lower end in the at least one selected from the group consisting of the longitudinal cross-section and the lateral cross-section.

17. An imaging device comprising:
a photoelectric conversion layer that converts light into electric charges; and
a microlens provided above the photoelectric conversion layer, wherein
an upper surface of the microlens forms a contour line in which a first curve projecting upward, a second curve projecting downward, and a third curve projecting upward are connected in this order in a cross-section of the imaging device,
the first curve is connected to the second curve at a first inflection point, and the second curve is connected to the third curve at a second inflection point, and
the first curve, an entirety of the second curve, and the third curve overlap the photoelectric conversion layer in plan view.

18. The imaging device according to claim 17, wherein the photoelectric conversion layer comprises an organic material and is configured to be capable of converting the light into the electric charges across a continuous area below the first curve, the entirety of the second curve, and the third curve in the plan view.

* * * * *